(12) United States Patent
Choi et al.

(10) Patent No.: US 11,963,311 B2
(45) Date of Patent: Apr. 16, 2024

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Jae Woong Choi, Suwon-si (KR); Yun Je Ji, Suwon-si (KR); Seung Eun Lee, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 125 days.

(21) Appl. No.: 17/704,303

(22) Filed: Mar. 25, 2022

(65) Prior Publication Data

US 2023/0171900 A1    Jun. 1, 2023

(30) Foreign Application Priority Data

Dec. 1, 2021  (KR) .................. 10-2021-0170044

(51) Int. Cl.
*H05K 1/11* (2006.01)
*H01L 23/498* (2006.01)
*H05K 1/18* (2006.01)
*H05K 3/34* (2006.01)
*H05K 3/46* (2006.01)

(52) U.S. Cl.
CPC ..... *H05K 3/4697* (2013.01); *H01L 23/49822* (2013.01); *H01L 23/49838* (2013.01); *H05K 1/115* (2013.01); *H05K 1/182* (2013.01); *H05K 1/183* (2013.01); *H05K 3/34* (2013.01); *H05K 3/4644* (2013.01); *H05K 2201/096* (2013.01); *H05K 2201/10015* (2013.01); *H05K 2201/10734* (2013.01)

(58) Field of Classification Search
None
See application file for complete search history.

(56) References Cited

U.S. PATENT DOCUMENTS 5,646,828 A * 7/1997 Degani ............... H01L 23/5385
257/E23.008
9,837,394 B2 * 12/2017 Clevenger ......... H01L 23/49827
2011/0123808 A1 * 5/2011 Lee ......................... H05K 1/185
156/60

(Continued)

FOREIGN PATENT DOCUMENTS

KR  10-2015-0103835 A  9/2015
KR  10-2020-0028602 A  3/2020

*Primary Examiner* — Hoa C Nguyen
*Assistant Examiner* — John B Freal
(74) *Attorney, Agent, or Firm* — MORGAN, LEWIS & BOCKIUS LLP

(57) ABSTRACT

A printed circuit board and a method of manufacturing the same are provided. The printed circuit board includes a wiring substrate including a plurality of insulating layers, a plurality of wiring layers, and a plurality of via layers and having a cavity penetrating through a portion of the plurality of insulating layers, a passive component disposed in the cavity and including an external electrode electrically connected to at least one of the plurality of wiring layers, and a bridge disposed on the passive component in the cavity and including one or more circuit layers electrically connected to the external electrode.

17 Claims, 23 Drawing Sheets

(56) References Cited

U.S. PATENT DOCUMENTS

2015/0255427 A1 9/2015 Sung et al.
2020/0083179 A1 3/2020 Lee et al.
2022/0310577 A1* 9/2022 Lee .................... H01L 25/0652

* cited by examiner

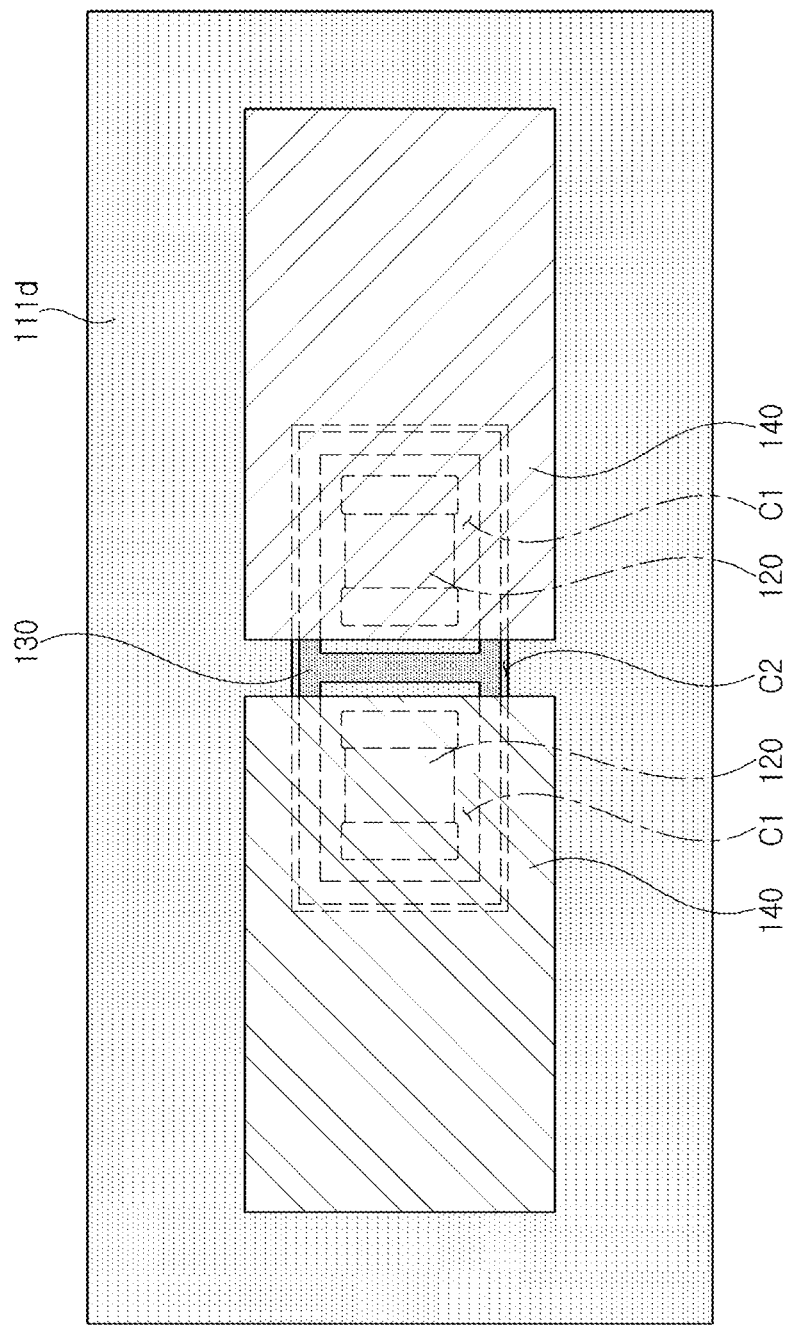

US 11,963,311 B2

1

PRINTED CIRCUIT BOARD AND METHOD OF MANUFACTURING THE SAME

CROSS-REFERENCE TO RELATED APPLICATION(S)

The present application claims the benefit of priority to Korean Patent Application No. 10-2021-0170044, filed on Dec. 1, 2021 in the Korean Intellectual Property Office, the entire disclosure of which is incorporated herein by reference.

TECHNICAL FIELD

The present disclosure relates to a printed circuit board having a cavity in which a bridge for die-to-die connection, or the like, may be disposed, and a method of manufacturing the same.

BACKGROUND

The market for interposers has been growing, due to the high specification of sets and the employment of a high bandwidth memory (HBM). At present, silicon is a mainstream material of interposers. However, in the case of a silicon interposer, material costs may be high, the manufacturing process of a through-silicon via (TSV) may be complex, and manufacturing costs may be high.

To address the above issues, a substrate including a silicon interconnect bridge capable of electrical die-to-die connection has been developed. However, in the case of a silicon interconnect bridge, there may be a reliability issue caused by a mismatch between coefficients of thermal expansion of a silicon material of the bridge and an organic material of a substrate, and power integrity characteristics may be degraded.

SUMMARY

An aspect of the present disclosure is to provide a printed circuit board in which a bridge for die-to-die interconnection may be disposed.

Another aspect of the present disclosure is to provide a printed circuit board which may reduce costs.

Another aspect of the present disclosure is to provide a printed circuit board which may improve power integrity characteristics.

According to an aspect of the present disclosure, a passive component may be disposed in a cavity of a substrate, a bridge may be disposed on the passive component, and dies disposed on the substrate may be connected to each other using the bridge.

For example, a printed circuit board includes: a wiring substrate including a plurality of insulating layers, a plurality of wiring layers, and a plurality of via layers and having a cavity penetrating through a portion of the plurality of insulating layers; a passive component disposed in the cavity; and a bridge disposed on the passive component in the cavity.

For example, a printed circuit board includes: a wiring substrate including a plurality of insulating layers, a plurality of wiring layers, and a plurality of via layers connected to one or more of the plurality of wiring layers, wherein the plurality of wiring layers are stacked in a thickness direction of the wiring substrate; and a first passive component and a bridge stacked on each other in the thickness direction and embedded in the wiring substrate.

2

For example, a method of manufacturing a printed circuit board includes: preparing a wiring substrate including a plurality of insulating layers, a plurality of wiring layers, and a plurality of via layers; forming a cavity to penetrate through a portion of the plurality of insulating layers; and disposing a passive component and a bridge in the cavity. In the disposing a passive component and a bridge, the bridge is disposed on the passive component.

BRIEF DESCRIPTION OF DRAWINGS

The above and other aspects, features, and advantages of the present disclosure will be more clearly understood from the following detailed description, taken in conjunction with the accompanying drawings.

FIG. 7 is a schematic plan view illustrating a printed circuit board according to an exemplary embodiment.

DETAILED DESCRIPTION

Hereinafter, exemplary embodiments in the present disclosure will be described with reference to the accompanying drawings. In the accompanying drawings, shapes, sizes, and the like, of components, may be exaggerated or shortened for clarity.

Electronic Device

Figure 1:
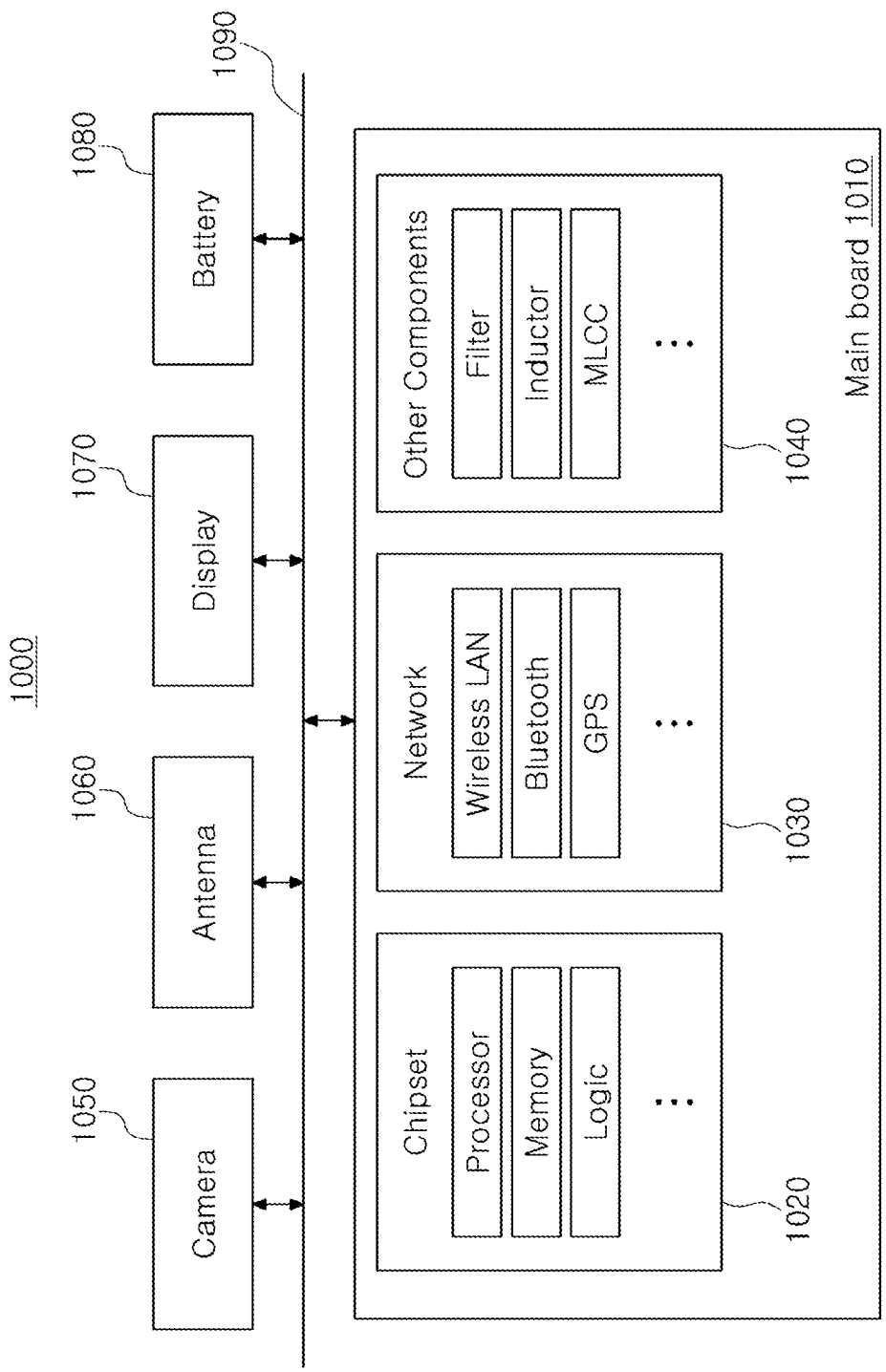
FIG. 1 is a schematic block diagram illustrating an example of an electronic device system.

FIG. 1 is a schematic block diagram illustrating an example of an electronic device system.

Referring to the drawing, an electronic device 1000 may accommodate a main board 1010 therein. Chip-related components 1020, network-related components 1030, other components 1040, and the like, may be physically and/or electrically connected to the main board 1010. These components may be coupled to other electronic components to be described later to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other. The chip-related component 1020 may be in the form of a package including the above-described chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the above-mentioned protocols. However, the network-related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. Other components may include, for example, a camera module 1050, an antenna module 1060, a display device 1070, a battery 1080, and the like. However, other components are not limited thereto, and may include an audio codec, a video codec, a power amplifier, a compass, an accelerometer, a gyroscope, a speaker, a high-capacity storage device (for example, a hard disk drive), a compact disk (CD) drive, a digital versatile disk (DVD) drive, and the like. However, other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
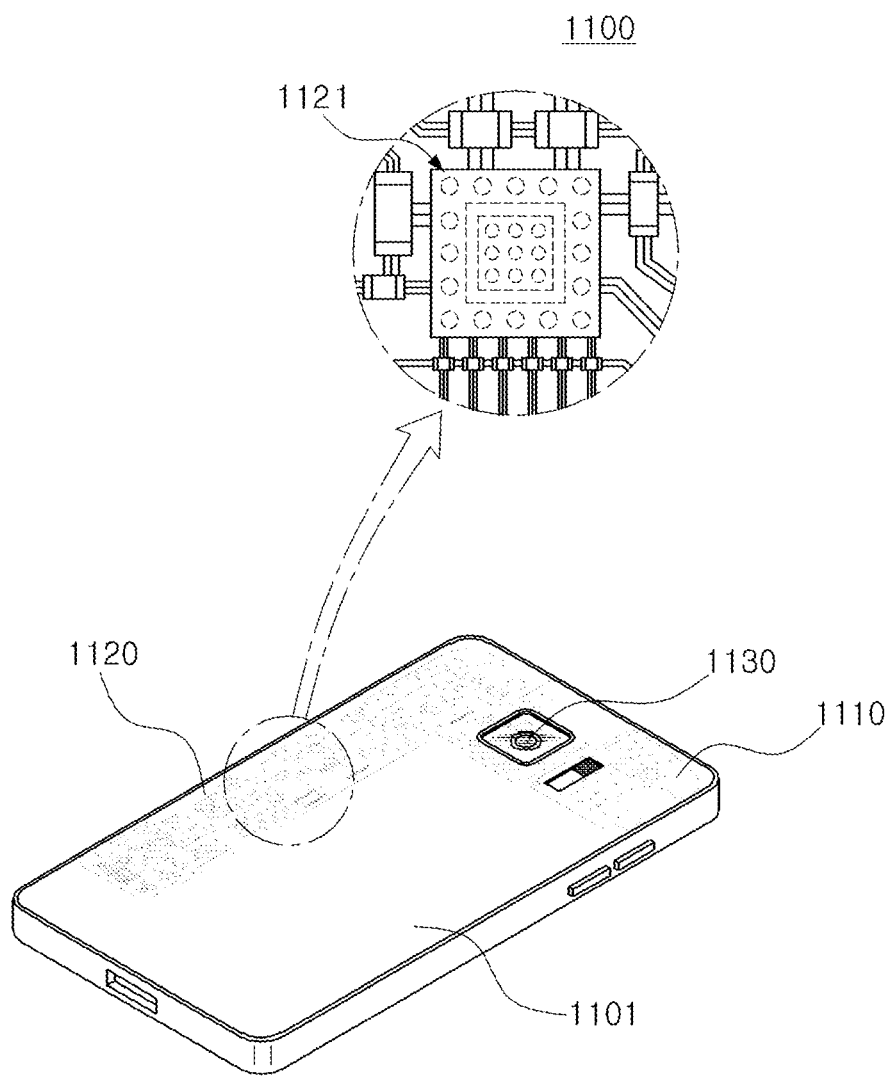
FIG. 2 is a schematic perspective view illustrating an example of an electronic device.

FIG. 2 is a schematic perspective view illustrating an example of an electronic device.

Referring to the drawing, an electronic device may be, for example, a smartphone 1100. A motherboard 1110 may be accommodated in the smartphone 1100, and various electronic components 1120 may be physically or electrically connected to the motherboard 1110. In addition, other components that may or may not be physically or electrically connected to the motherboard 1110, such as a camera module 1130 and/or a speaker 1140, may be accommodated in the motherboard 1110. Some of the electronic components 1120 may be the chip-related components, for example, a semiconductor package 1121, but are not limited thereto. The component package 1121 may be in the form of a printed circuit board having a surface on which electronic components including active components and/or passive components are mounted. Alternatively, the component package 1121 may be in the form of a printed circuit board in which active and/or passive components are embedded. On the other hand, the electronic device is not limited to the smartphone 1100, and may be another electronic device as described above.

Semiconductor Package Including Organic Interposer

In general, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Semiconductor packaging is required because there is a difference in circuit width between the semiconductor chip and a main board of the electronic device in terms of electrical connections. In detail, in the case of a semiconductor chip, a size of connection pads of the semiconductor chip and an interval between the connection pads of the semiconductor chip are very fine, but a size of component mounting pads of the main board used in the electronic device and an interval between the component mounting pads of the main board are significantly larger than a scale of the semiconductor chip. Therefore, it may be difficult to directly mount the semiconductor chip on the main board, and packaging technology for buffering a difference in circuit width between the semiconductor chip and the main board is required.

Hereinafter, a semiconductor package including an organic interposer manufactured using such a packaging technology will be described in greater detail with reference to the drawings.

Figure 3:
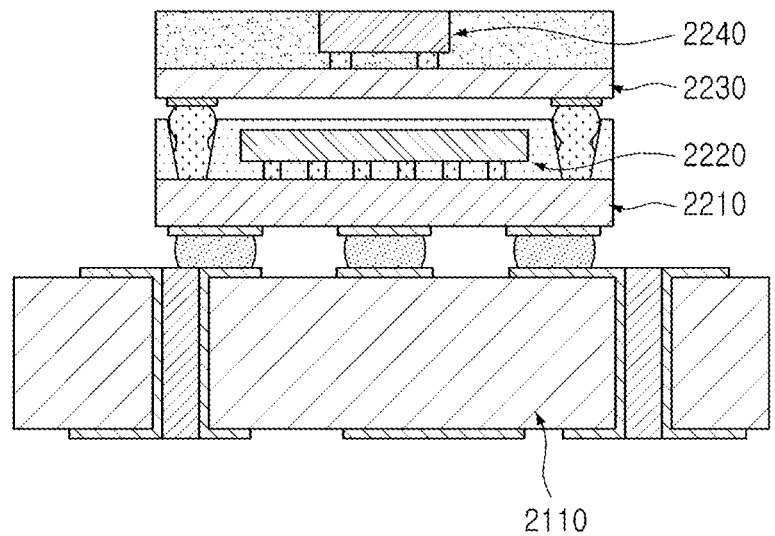
FIG. 3 is a schematic cross-sectional view illustrating a case in which a BGA package is mounted on a main board of an electronic device.

FIG. 3 is a schematic cross-sectional view illustrating a case in which a BGA package is mounted on a main board of an electronic device.

Among semiconductor chips, chips provided in an application specific integrated circuit (ASIC), such as a graphics processing unit (GPU), are significantly expensive, and thus, it may be important to perform a packaging in high yield. To this end, a ball grid array (BGA) substrate 2210, capable of redistributing several thousands or several millions of connection pads, may be prepared before mounting a semiconductor ship, and an expensive semiconductor chip such as a GPU 2220 may be mounted on the BGA substrate 2210 by surface mounting technology (SMT) and packaged, and then mounted on a main board 2110.

In the case of the GPU 2220, it may be necessary to significantly reduce a signal path to a memory such as a high bandwidth memory (HBM). To this end, a semiconductor chip such as an HBM 2220 is mounted on an interposer 2230 and packaged, and the semiconductor is stacked in a form of package-on-package on the package on which the GPU 2220 is mounted. However, in this case, a thickness of a device may be significantly increased, and there may be a limitation in significantly reducing a signal path.

Figure 4:
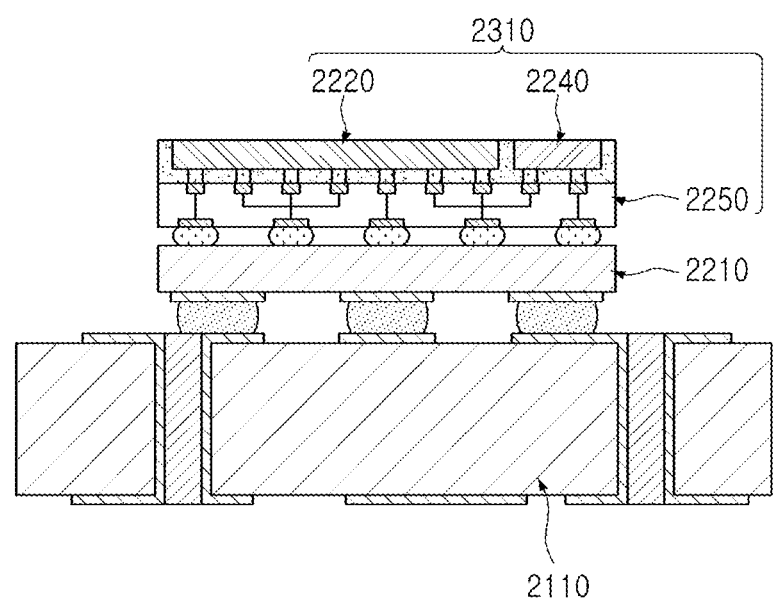
FIG. 4 is a schematic cross-sectional view illustrating a case in which a silicon interposer package is mounted on a main board.

FIG. 4 is a schematic cross-sectional view illustrating a case in which a silicon interposer package is mounted on a main board.

To address the above-described issues, a semiconductor package 2310 including a silicon interposer may be manufactured using an interposer technique of mounting a first semiconductor chip such as a GPU 2220 and a second semiconductor chip such as an HBM 2240 side by side on a surface of a silicon interposer 2250 and packaging the semiconductor chips. In this case, the GPU 2220 and the HBM 2240 having several thousands or several millions of connection pads may be redistributed by the silicon interposer 2250. In addition, the GPU 2220 and the HBM 2240 may be electrically connected to each other by a significantly reduced path. When the semiconductor package 2310 including such a silicon interposer is mounted on a BGA substrate 2210, and the like, again and redistributed, the semiconductor package may be finally mounted on a main board 2110. However, in the case of the silicon interposer 2250, it may be significantly difficult to form a through-silicon via (TSV), and manufacturing costs of the silicon interposer are also high, which is disadvantageous in terms of large area and low cost.

Figure 5:
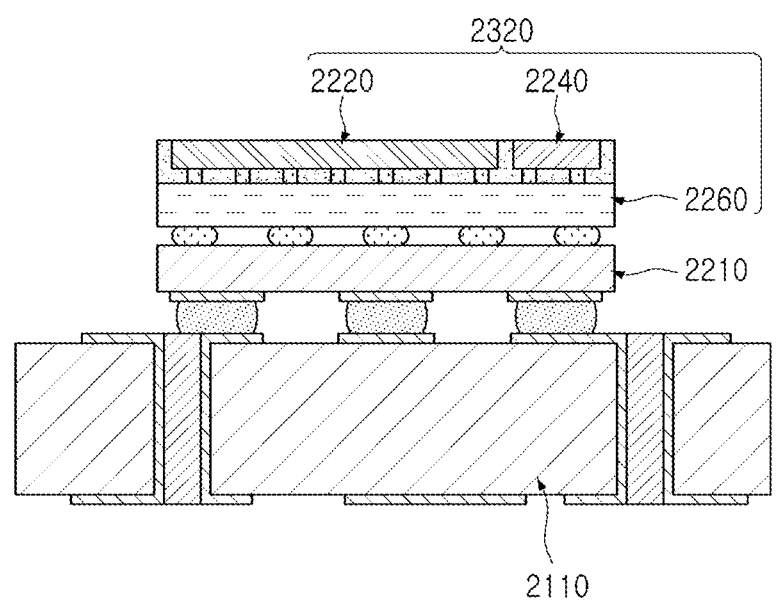
FIG. 5 is a schematic cross-sectional view illustrating a case in which an organic interposer package is mounted on a main board.

FIG. 5 is a schematic cross-sectional view illustrating a case in which an organic interposer package is mounted on a main board.

To address the above-described issues, an organic interposer 2260, rather than a silicon interposer 2250, may be used. For example, a semiconductor package 2310 including an organic interposer may be manufactured using an interposer technique of mounting a first semiconductor chip such as a GPU 2220 and a second semiconductor chip such as an HBM 2240 side by side on a surface of an organic interposer 2260 and packaging the semiconductor chips. In this case, the GPU 2220 and the HBM 2240 having several thousands or several millions of connection pads may be redistributed by the organic interposer 2260. In addition, the GPU 2220 and the HBM 2240 may be electrically connected to each other by a significantly reduced path. When the semiconductor package 2310 including such an organic interposer is mounted on a BGA substrate 2210, and the like, and redistributed, the semiconductor package may be finally mounted on a main board 2110, which is advantageous in terms of large area and low cost.

In the case of a semiconductor package 2320 including such an organic interposer, the semiconductor package may be manufactured by performing a packaging process in which the chips 2220 and 2240 are mounted on the interposer 2260 and then molded. This is because chips may not be handled when the molding process is not performed, and thus, may not be connected to the BGA substrate 2210. Accordingly, rigidity may be maintained by the molding process. However, when the molding process is performed, mismatch between coefficients of thermal expansion of the interposer 2260 and molding materials of the chips 2220 and 2240 may occur, resulting in warpage, deterioration of filling properties of underfill resin, cracking between a die and the molding material, and the like.

Printed Circuit Board Including Bridge and Passive Component

Hereinafter, with reference to accompanying drawings, a description will be provided as to a printed circuit board having a novel structure in which a bridge for interconnection of dies, a passive component for improving power integrity characteristics, and the like, are disposed in a cavity of a wiring substrate.

When a printed circuit board to be described below is used as a BGA board of a semiconductor package, the above-described additional interposer may be omitted, as necessary.

Figure 6:
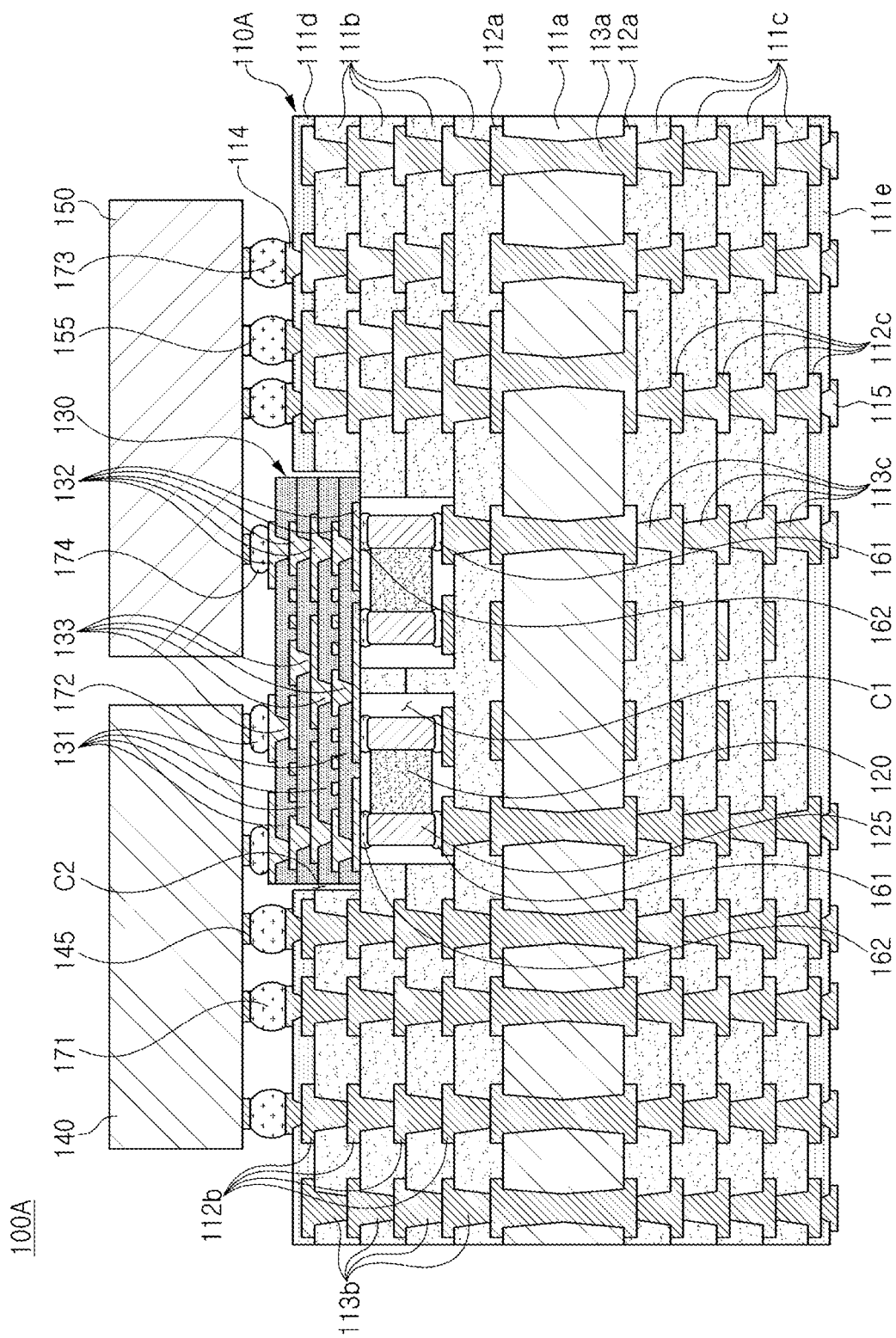
FIG. 6 is a schematic cross-sectional view illustrating a printed circuit board according to an exemplary embodiment.

FIG. 6 is a schematic cross-sectional view illustrating a printed circuit board according to an exemplary embodiment.

FIG. 7 is a schematic plan view illustrating a printed circuit board according to an exemplary embodiment.

Referring to the drawings, a printed circuit board 100A according to an exemplary embodiment may include an interconnection substrate 100A, a passive component 120, and a bridge 130. The interconnection substrate 100A may include a plurality of insulating layers 111a, 111b, 111c, 111d, and 111e and a plurality of wiring layers 112a, 112b, and 112c, and may have cavities C1 and C2 penetrating through a portion of the plurality of insulating layers 111a, 111b, 111c, 111d, and 111e. The passive component 120 may be disposed in the cavities C1 and C2, and the bridge 130 may be disposed on the passive component 120 in the cavities C1 and C2.

As necessary, the printed circuit board 100A according to an exemplary embodiment may further include a plurality of dies 140 and 150 disposed side by side on the wiring substrate 110A to be spaced apart from each other and electrically connected to each other through a bridge. For example, the printed circuit board 100A according to an exemplary embodiment may have a package structure.

As described above, the printed circuit board 100A according to an exemplary embodiment includes the bridge 130 to effectively implement mounted die-to-die interconnection. In addition, the bridge 130 may be relatively simply mounted, such as disposing the bridge 130 in the cavities C1 and C2 of the wiring substrate 110A, so that difficulty of process may be reduced and the cost may be reduced. In addition, the passive component 120 may be disposed together with the bridge 130 in the cavities C1 and C2 to stably improve power integrity characteristics, and the like. In particular, the bridge 130 may be disposed to be vertically stacked on the passive component 120 in the cavities C1 and C2, so that an electrical connection path after mounting a die may be significantly short in a vertical form, and thus, power integrity characteristics, and the like, may be effectively improved.

The cavities C1 and C2 may include a first cavity C1, in which the passive component 120 is disposed, and a second cavity C2, disposed in the first cavity C1, in which the bridge 130 is disposed. The second cavity C2 may have a larger area than the first cavity C1 in a plan view. In this regard, external sidewalls of each of the first cavity C1 and the second cavity C2 may have a step in a cross-section. For example, the first cavity C1 and the second cavity C2 may have a multi-stage structure. In this case, planarization may be performed even after the passive component 120 is mounted, and risks that may occur during mounting of the bridge 130, for example, damage to the bridge 130 caused by a pressure load generated when the dies 140 and 150 are mounted, may be addressed.

In the present disclosure, the phrase "in a cross-sectional view" may refer to a cross-sectional shape when the object is vertically cut, or a cross-sectional shape when the object is viewed in a side view. In addition, the phrase "in plan view" may refer to a shape when the object is horizontally cut, or a planar shape when the object is viewed in a top view or in a bottom view.

The first cavity C1 may include a plurality of first cavities C1, and the passive component 120 may include a plurality of passive components 120 disposed in the plurality of first cavities C1. Each of the passive components 120 may be disposed in each of the first cavity C1, but exemplary embodiments are not limited thereto. As necessary, two or more passive components 120 may be disposed together in one first cavity C1. In this case, at least one portion of the insulating layer 111b may be disposed between the plurality of first cavities C1. Accordingly, the bridge 130 may be more stably disposed.

A lower portion of an external electrode 125 of the passive component 120 may be bonded to a wiring layer 112b, exposed to a bottom surface of the first cavity C1, with a first conductive adhesive 161. In addition, an upper portion of the external electrode 125 of the passive component 120 may be bonded to the circuit layer 132, disposed on a lowermost side of the bridge 130, with a second conductive adhesive 162. Each of the first and second conductive adhesives 161 and 162 may include solder, but exemplary embodiments are not limited thereto. Accordingly, the wiring substrate 110A, the passive component 120, and the bridge 130 may be vertically, physically and electrically connected to each other.

The bridge 130 may have a body including an organic insulating material. For example, the bridge 130 may be an organic bridge. Therefore, even when the bridge 130 is disposed on the wiring substrate 110A, a reliability issue caused by CTE mismatch may hardly occur in the bridge 130, unlike a silicon bridge. In addition, difficulty of process and costs for forming the bridge 130 may be reduced. A photoimageable dielectric (PID) may be used as the organic insulating material to form a microcircuit, but exemplary embodiments are not limited thereto.

One or more circuit layers 132 may have a higher density than the plurality of wiring layers 112a, 112b, and 112c. For example, the one or more circuit layers 132 may be a high-density circuit having a smaller line/space (L/S) and/or a lower thickness than the plurality of wiring layers 112a, 112b, and 112c, which may be effective for die-to-die interconnection. In this regard, a via layer 133 of the bridge 130 may be formed to have a finer pitch than the via layers 113a, 113b, and 113c of the wiring substrate 110A. Accordingly, the one or more circuit layers 132 may be easily designed to have high density.

The passive component 120 may have a chip shape. For example, the passive component 120 may include a chip-type multilayer ceramic capacitor (MLCC). Accordingly, the wiring substrate 110A may be separately manufactured, and a mounting process may be relatively simple.

Hereinafter, components of the printed circuit board 100A according to an exemplary embodiment will be described in greater detail with reference to accompanying drawings.

The wiring substrate 110A may include a plurality of insulating layers 111a, 111b, 111c, 111d, and 111e, a plurality of wiring layers 112a, 112b, and 112c, and a plurality of via layers 113a, 113b, and 113c. The wiring substrate 110A may have a core shape. For example, the wiring substrate 110A may include a core insulating layer 111a, first wiring layers 112a respectively disposed on opposite surfaces of the core insulating layer 111a, a first via layer 113a penetrating through the core insulating layer 111a and electrically connecting the first wiring layers 112a to each other, at least one first build-up insulating layer 111b built-up upwardly of the core insulating layer 111a, at least one second wiring layers 112b disposed on the first build-up insulating layer 111b, at least one second via layer 113b penetrating through the first build-up insulating layer 111b, at least one second build-up insulating layer 111c built-up downwardly of the core insulating layer 111a, at least one third wiring layer 112c disposed on the second build-up insulating layer 111c, at least one third via layer 113c penetrating through the second build-up insulating layer 111c, a first passivation layer 111d disposed on the first build-up insulating layer 111b, and a second passivation layer 111e disposed on the second build-up insulating layer 111c. However, exemplary embodiments are not limited thereto, and the wiring substrate 100A may have a coreless shape, as necessary.

The core insulating layer 111a may serve as a core layer of the wiring substrate 110A, and may provide rigidity. A material of the core insulating layer 111a is not limited. For example, an insulating material may be used as the material of the core insulating layer 111a. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, Bismaleimide Triazine (BT), or the like, but exemplary embodiments are not limited thereto. The core insulating layer 111a may be introduced through a copper clad laminate (CCL). The core insulating layer 111a may have a higher modulus than the build-up insulating layers 111b and 111c, but exemplary embodiments are not limited thereto. The core insulating layer 111a may have a higher thickness than each of the build-up insulating layers 111b and 111c.

The build-up insulating layers 111b and 111c may be introduced to be built up on opposite sides of the core insulating layer 111a with reference to the core insulating layer 111a. A material of the build-up insulating layers 111b and 111c may also not be limited. For example, an insulating material may be used, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material, such as prepreg, an Ajinomoto Build-up Film (ABF), FR-4, BT, and the like, but exemplary embodiments are not limited thereto. The build-up insulating layers 111b and 111c may be built up on the opposite sides of the core insulating layer 111a in the same manner. Accordingly, the build-up insulating layers 111b and 111c may have the same number of layers. The number of the build-up insulating layers 111b and the number of the build-up insulating layers 111c may not be limited, and may vary depending on designs thereof.

The passivation layers 111d and 111e may be disposed on opposite outermost portions of the printed circuit board 110A to protect internal components of the printed circuit board 110A. A plurality of openings may be formed in each of the passivation layers 111d and 111e to expose a portion of the wiring layers 112b and 112c. A material of the passivation layers 111d and 111e may not be limited. For example, an insulating material may be used as the material of the passivation layers 111d and 111e. In this case, a solder resist may be used. However, an insulating material may not be limited thereto, and an ABF, or the like, may be used.

The wiring layers 112a, 112b, and 112c may perform various functions in the printed circuit board 110A depending on designs thereof. For example, the wiring layers 112a, 112b, and 112c may include a ground pattern, a power pattern, a signal pattern, and the like. In this case, the signal pattern may include various signals, other than the ground pattern, the power pattern, and the like, such as a data signal. Each of the signal patterns may include a line pattern, a plane pattern, and/or a pad pattern. A material of the wiring layers 112a, 112b and 112c may be a conductive material such as copper (Cu), aluminum (Al), silver (Ag), tin (Sn), gold (Au), nickel (Ni), lead (Pb), titanium (Ti), or alloys thereof, in detail, a metal material. Each of the wiring layers 112a, 112b, and 112c may include an electroless plating layer (or chemical copper) and an electroplating layer (or electrolytic copper).

The via layers 113a, 113b, and 113c may electrically connect the wiring layers 112a, 112b, and 112c disposed on different layers, and thus, an electrical path may be formed in the printed circuit board 110A. The via layers 113a, 113b, and 113c may perform various functions in the printed circuit board 110A depending on designs thereof. For example, the via layers 113a, 113b and 113c may include a ground via, a power via, a signal vias, and the like. Each of the via layers 113a, 113b, and 113c may include a plurality of connection vias. The connection via of each of the via layers 113a, 113b, and 113c may include a conductive material, such as copper (Cu), aluminum (Al), silver (Ag), tin (Sn), gold (Au), nickel (Ni), lead (Pb), titanium (Ti), or alloys thereof, in detail, a metal material. Each of the via layers 113a, 113b, and 113c may include an electroless plating layer (or chemical copper) and an electroplating layer (or electrolytic copper). The connection via of each of the via layers 113a, 113b and 113c may be a filled type via, filled with a conductive material, or may be conformal type vias in which a conductive material is disposed along a wall surface of a via hole. The connection via of the first via layer 113a may have an hourglass shape, a cylindrical shape, or the like, and the connection vias of the second and third via layers 113b and 113c may have tapered shapes formed in opposite directions.

The cavities C1 and C2 may be formed in an upper region, in which dies 140 and 150 of the wiring substrate 110A are mounted, for example, the build-up insulating layer 111b and/or the passivation layer 111d. The first cavity C1 may include a plurality of first cavities C1, and each of the first cavities C1 may penetrate through a portion of the build-up insulating layer 111b. The second cavity C2 may penetrate through a portion of the build-up insulating layer 111b and the passivation layer 111d. Each of the first cavity C1 and the second cavity C2 may have a rectangular shape, but exemplary embodiments are not limited thereto and each of the first cavity C1 and the second cavity C2 may have other shapes.

As necessary, bump layers 114 and 115 connected to the exposed wiring layers 112b and 112c may be disposed on openings of the passivation layers 111d and 111e, respectively. The bump layers 114 and 115 may include a plurality of bumps, and each of the plurality of bumps may include a pad and a via. Solder bonding may be facilitated through the bump layers 114 and 115. The bump layers 114 and 115 may include a conductive material, such as copper (Cu), aluminum (Al), silver (Ag), tin (Sn), gold (Au), nickel (Ni), lead (Pb), titanium (Ti), or alloys thereof, in detail, a metal material. Each of the bump layers 114 and 115 may include an electroless plating layer (or chemical copper) and an electroplating layer (or electrolytic copper).

The passive component 120 may provide power supply stability, and the like. The passive component 120 may include a plurality of passive components 120, and each of the plurality of passive components 120 may be disposed in the first cavity C1. The plurality of passive components 120 may be the same or different from each other. Each of the plurality of passive components 120 may include an external electrode 125. For example, each of the plurality of passive components 120 may be an independent chip-type passive component. Such a chip-type passive component may be, for example, a chip-type capacitor, a chip-type inductor, or the like, but exemplary embodiments are not limited thereto.

The passive component 120 may be vertically connected to the wiring substrate 110A and the bridge 130 through conductive adhesives 161 and 162. In this case, the conductive adhesives 161 and 162 may each be formed of a paste including a low-melting-point metal, for example, a paste including a solder such as tin-aluminum-copper (Sn—Al—Cu), or the like, but exemplary embodiments are not limited thereto. In addition, other known electrically conductive pastes may also be used.

The bridge 130 may provide die-to-die interconnection, or the like. The bridge 130 may be disposed in the second cavity C2. The bridge 130 may be a silicon bridge manufactured by forming a circuit layer through a deposition process using silicon dioxide as an insulating body, an organic bridge manufactured by forming a circuit layer through a plating process using an organic insulating material as an insulating body, or the like, in detail, an organic bridge, but exemplary embodiments are not limited thereto. The bridge 130 may include one or more insulating layers 131, one or more circuit layers 132, and one or more via layers 133.

The insulating layer 131 may provide a body of the bridge 130. The insulating layer 131 may include an insulating material. In this case, the insulating material may be a photoimageable dielectric (PID). When a PID is used as the material of the insulating layer 131, a thickness of the insulating layer 121 may be significantly reduced and a photo via hole may be formed. Accordingly, the circuit layer 132 and the connection via layer 133 may be easily designed to have high density. However, the material is not limited thereto, and other organic insulating materials may be used. The number of layers included in the insulating layer 131 is not limited, and may vary depending on a design thereof. Boundaries between the insulating layers 131 may or may not be readily apparent.

The circuit layer 132 may provide a die-to-die interconnection path. The circuit layer 132 may perform various functions depending on a design of a corresponding layer, and may include at least a signal pattern. The circuit layer 132 may include a conductive material, such as copper (Cu), aluminum (Al), silver (Ag), tin (Sn), gold (Au), nickel (Ni), lead (Pb), titanium (Ti), or alloys thereof, in detail, a metal material. The circuit layer 132 may include an electroless plating layer (or chemical copper) and an electroplating layer (or electrolytic copper). The number of layers included in the circuit layer 132 is also not limited, and may vary depending on a design thereof.

The via layer 133 may electrically connect the circuit layers 132, formed on different layers, to each other and may provide an electrical path in the bridge 130. The via layer 133 may perform various functions depending on a design of a corresponding layer, and may include at least one signal via. Each of the via layers 133 may include a plurality of connection vias. The connection vias of each of the via layers 123 may include a conductive material such as copper (Cu), aluminum (Al), silver (Ag), tin (Sn), gold (Au), nickel (Ni), lead (Pb), titanium (Ti), or alloys thereof, in detail, a metal material. Each of the via layers 133 may include an electroless plating layer (or chemical copper) and electroplating layer (or electrolytic copper). The connection vias of each of the via layers 123 may be a filled type via, filled with a conductive material, or may be a conformal type via in which a conductive material is disposed along a wall surface of the via. The connection vias of each of the via layers 123 may have tapered shapes formed in opposite directions.

Each of the dies 140 and 150 may be a semiconductor chip. The semiconductor chip may include an integrated circuit (IC) in which several hundreds to several millions of devices are integrated in a single chip. The integrated circuit may be, for example, a logic chip, such as a central processing unit (CPU), a graphics processor (for example, a graphics processing unit (GPU)), a field programmable gate array (FPGA), a digital signal processor, a cryptographic processor, a microprocessor, a microcontroller, an application processor (AP), an analog-to-digital converter, an application-specific IC, or the like. However, the semiconductor chip is not limited thereto, and may be a memory chip such as a volatile memory (for example, a dynamic random access memory (DRAM)), a nonvolatile memory (for example, a read only memory (ROM)), a flash memory, a high bandwidth memory (HBM), or the like, or another chip such as a power management IC (PMIC). As an example, the first die 140 may include a logic chip such as a GPU, and the second die 150 may include a memory chip such as an HBM, but the dies 140 and 150 are not limited thereto.

Each of the dies 140 and 150 may be formed based on an active wafer. In this case, a base material forming a body of each of the dies 140 and 150 may be silicon (Si), germanium (Ge), gallium arsenide (GaAs), or the like. In the body, a connection pad may be formed. The connection pad may include a conductive material such as aluminum (Al), copper (Cu), or the like. Each of the dies 140 and 150 may be a bare die. In this case, metal bumps 145 and 155 may be disposed on the connection pad. Each of the dies 140 and 150 may be a packaged die. In this case, a redistribution layer may be additionally formed on the connection pad, and the bumps 145 and 155 may be disposed on the redistribution layer.

The dies 140 and 150 may be mounted on the wiring substrate 110A and the bridge 130 through connection members 171, 172, 173, and 174. For example, the first die 140 may be connected to the wiring substrate 110A and the bridge 130 through the first and second connection members 171 and 172. For example, the first connection member 171 may be connected to the first bump layer 114, and the second connection member 172 may be connected to the circuit layer 132. Also, the second die 150 may be connected to the wiring substrate 110A and the bridge 130 through the third and fourth connection members 173 and 174. For example, the third connection member 173 may be connected to the first bump layer 114, and the fourth connection member 174 may be connected to the circuit layer 132. Each of the connection members 171, 172, 173, and 174 may be formed of a low-melting-point metal, for example, a solder such as tin-aluminum-copper (Sn—Al—Cu), or the like, but this is only an example. The material of the connection members 171, 172, 173, and 174 is not limited thereto. Each of the connection members 171, 172, 173, and 174 may be formed to have a multilayer structure or a single-layer structure. When each of the connection members 171, 172, 173, and 174 is formed to have a multilayer structure, each of the connection members 171, 172, 173, and 174 may include a copper pillar and a solder, and when each of the connection members 171, 172, 173, and 174 is formed to have a single-layer structure, each of the connection members 171, 172, 173, and 174 may include tin-silver solder or copper, but exemplary embodiments are not limited thereto. The first and third connection members 171 and 173 may be thicker than the second and fourth connection members 172 and 174, respectively. For example, the first and third connection members 171 and 173 may have heights greater than those of the second and fourth connection members 172 and 174, respectively. However, exemplary embodiments are not limited thereto.

FIGS. 8A to 8I are schematic process diagrams illustrating a method of manufacturing a printed circuit board according to an exemplary embodiment.

Referring to the drawings, a method of manufacturing a printed circuit board 100A according to an exemplary embodiment may include preparing a wiring substrate 110A including a plurality of insulating layers 111a, 111b, 111c, 111d, and 111e, a plurality of wiring layers 112a, 112b, and 112c, and a plurality of via layers 113a, 113b, and 113c, forming cavities C1 and C2 to penetrate through a portion of the plurality of insulating layers 111a, 111b, 111c, 111d, and 111e, and disposing a passive component 120 and a bridge 130 in the cavities C1 and C2.

As necessary, the method of manufacturing a printed circuit board 100A according to an exemplary embodiment may further include disposing a plurality of dies 140 and 150 on the wiring substrate 110A.

In the preparing the wiring substrate 110A, a first dry film pattern 210 may be disposed in a build-up insulating layer 111b, among the plurality of insulating layers 111a, 111b, 111c, 111d, and 111e, to form the cavities C1 and C2 having a multi-stage shape. In addition, a second dry film pattern 220 may be disposed on a first passivation layer 111d, among the plurality of insulating layers 111a, 111b, 111c, 111d, and 111e.

In this case, the forming the cavities C1 and C2 may include forming a first cavity C1 using the first dry film pattern 210 and forming a second cavity C2 using the second dry film pattern 220. The second cavity C2 may be formed on the first cavity C1 and may have a larger area in a plane than the first cavity C1. In addition, in the disposing the passive component 120 and the bridge 130, the passive component 120 may be disposed in the first cavity C1 and the bridge 130 may be disposed in the second cavity C2.

Hereinafter, processes of the manufacturing method of a printed circuit board 100A according to an exemplary embodiment will be described in greater detail with reference to accompanying drawings.

Figure 8A:
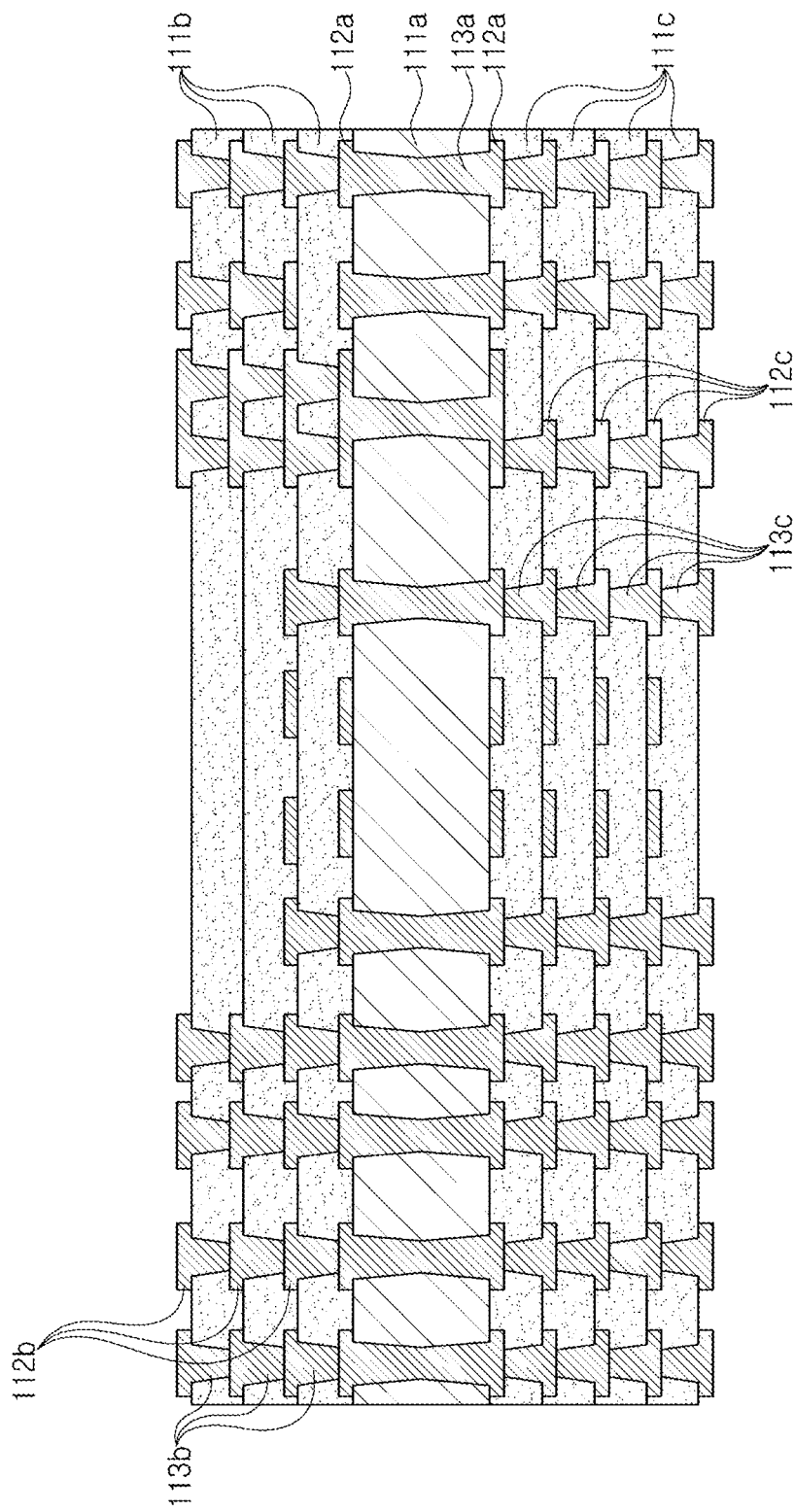
FIGS. 8A to 8I are schematic process diagrams illustrating a method of manufacturing a printed circuit board according to an exemplary embodiment.

Referring to FIG. 8A, an intermediate body of the wiring substrate 110A may be formed. For example, a portion of the core insulating layer 111a, the first wiring layer 112a, the first via layer 113a, and the first build-up insulating layer 111b, a portion of the second wiring layer 112b, a part of the second via layer 113b, a part of the second build-up insulating layer 111c, a portion of the third wiring layer 112c, and a portion of the third via layer 113c may be formed. The core insulating layer 111a may be formed using a copper clad laminate (CCL), or the like. The build-up insulating layers 111b and 111c may be formed by laminating prepreg, an ABF, or the like. The wiring layers 112a, 112b, and 112c and the via layers 113a, 113b, and 113c may be formed by a plating process.

Figure 8B:
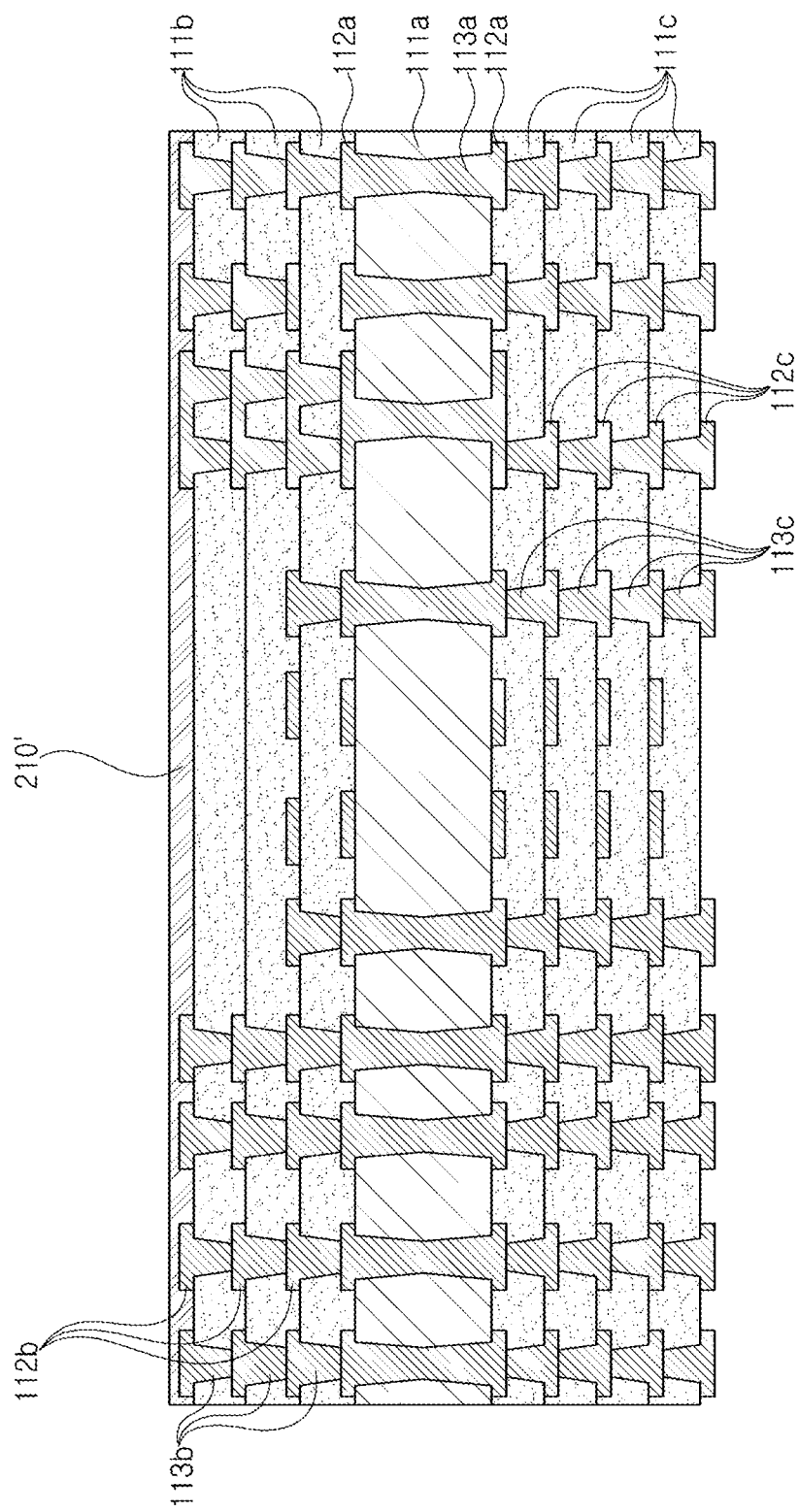

Referring to FIG. 8B, a first dry film 210' may be formed on the intermediate body of the wiring substrate 110A. The first dry film 210' may be a known dry film on which a photolithography process may be performed, and may be formed by a known applying method.

Figure 8C:
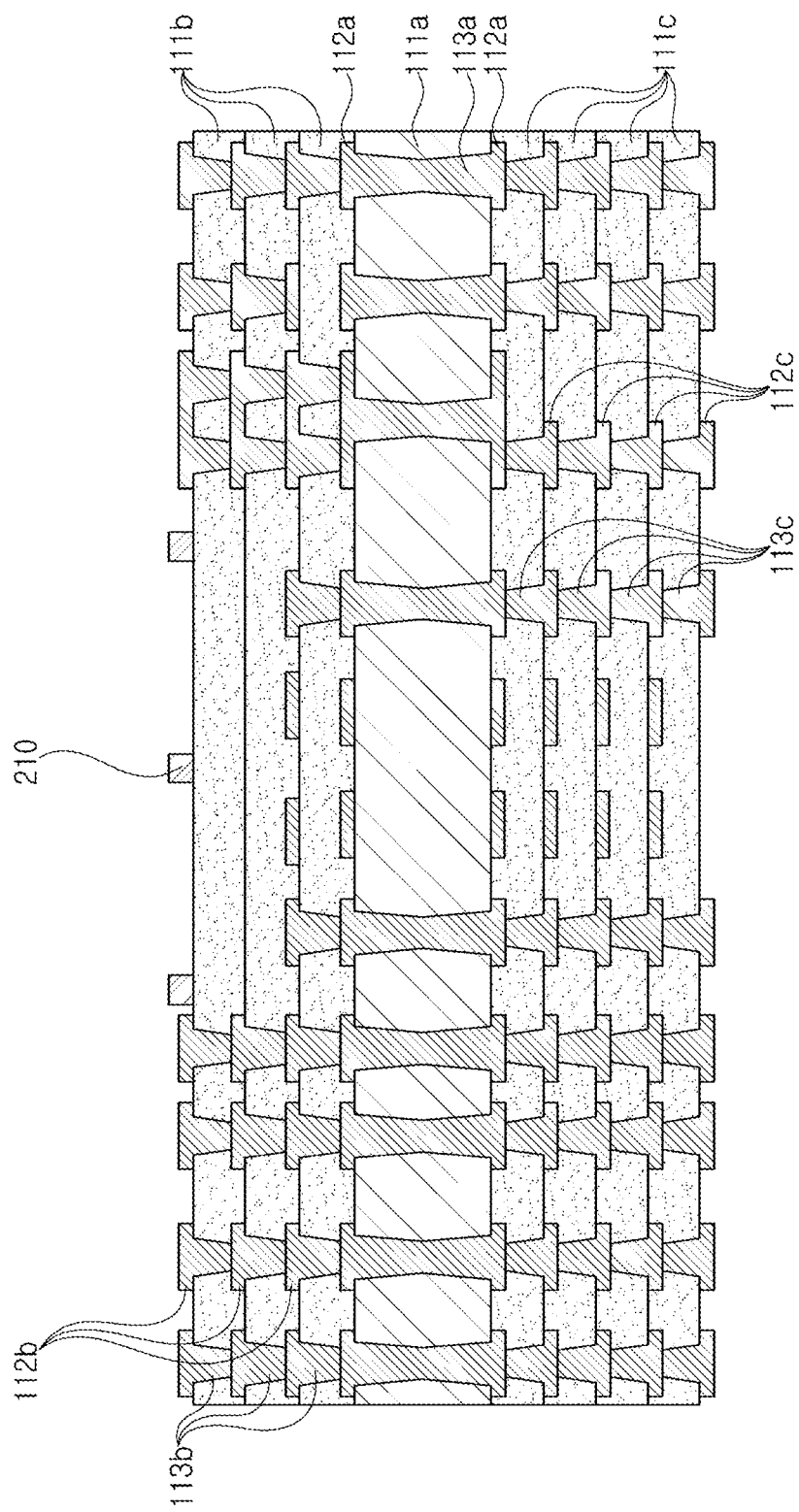

Referring to FIG. 8C, the first dry film 210' may be patterned to form a first dry film pattern 210. The patterning may be performed using exposure and development.

Figure 8D:
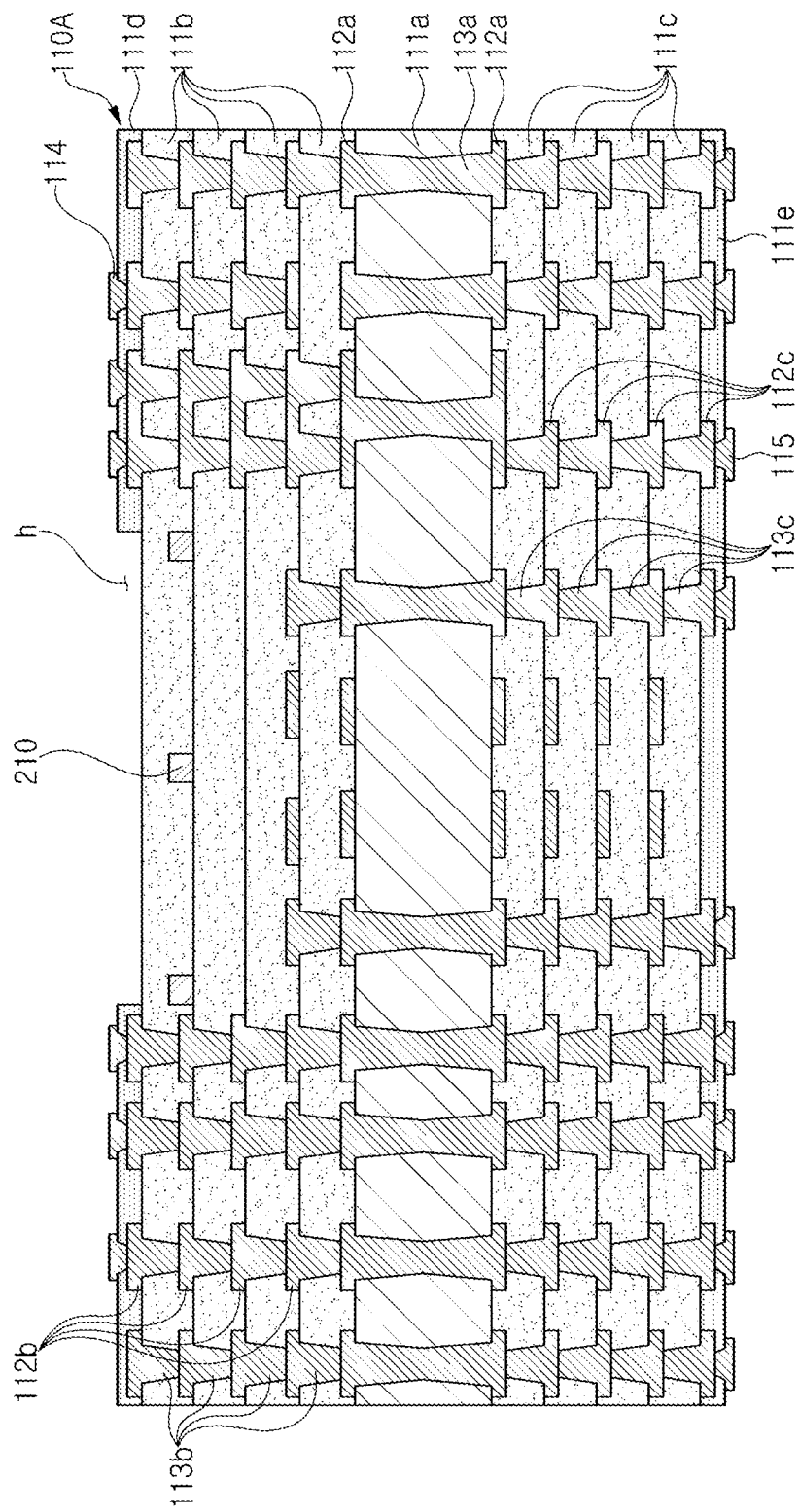

Referring to FIG. 8D, the other components of the wiring substrate 110A may be formed. For example, a remainder of the first build-up insulating layer 111b, a remainder of the second wiring layer 112b, a remainder of the second via layer 113b, a remainder of the second build-up insulating layer 111c, a remainder of the third wiring layer 112c, a remainder of the third via layer 113c, a first passivation layer 111d, a second passivation layer 111e, a first bump layer 114, and a second bump layer 115 may be formed. Accordingly, the wiring substrate 110A may be prepared. In addition, an opening h may be formed in the first passivation layer 111d to expose the second build-up insulating layer 111b in the upper region of the first dry film pattern 210. Accordingly, the wiring substrate 110A having the opening h and including the first dry film pattern 210 embedded therein may be formed as the wiring substrate 110A before the cavities C1 and C2 are formed.

Figure 8E:
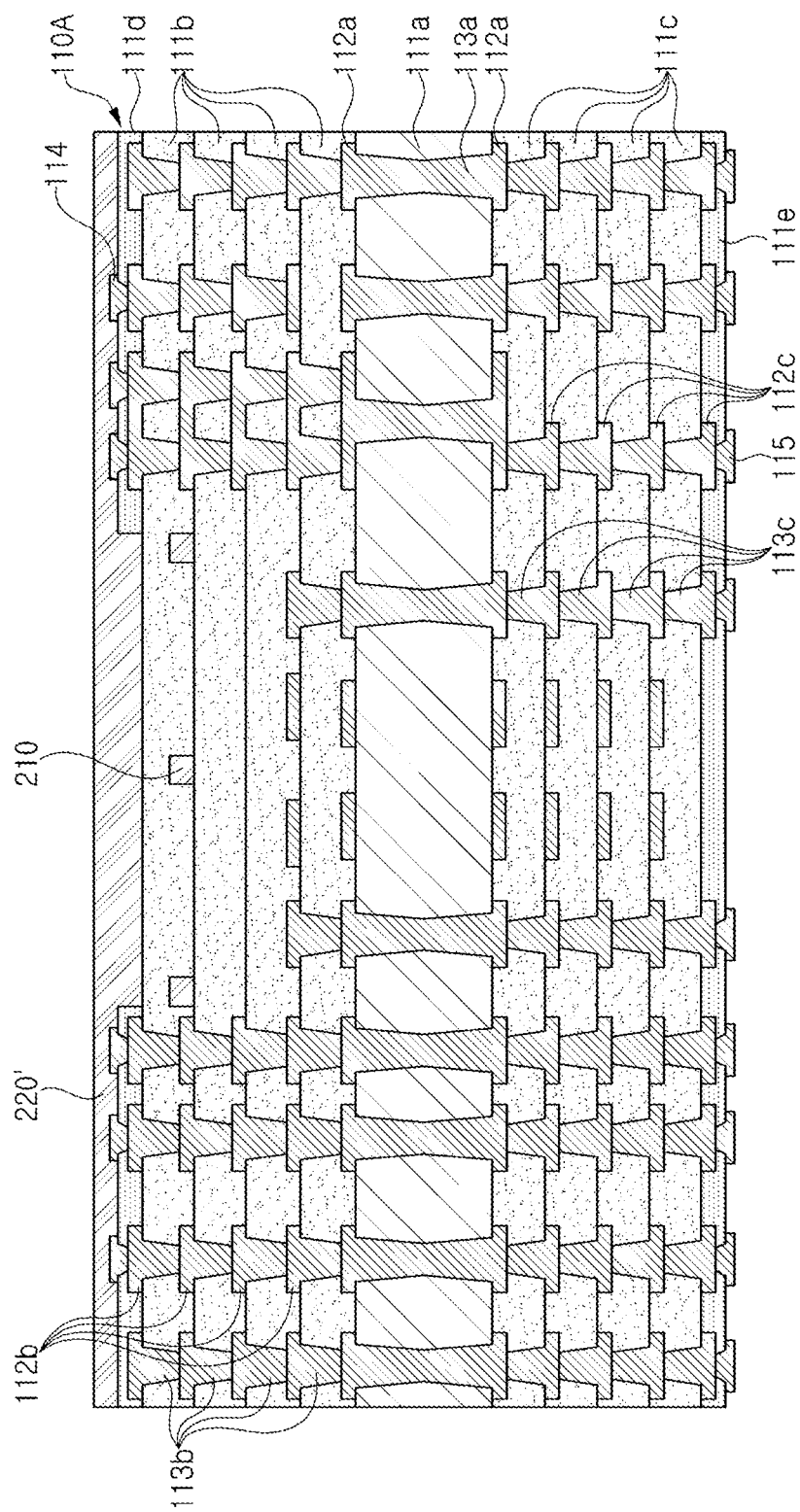

Referring to FIG. 8E, a second dry film 220' may be formed on the wiring substrate 110A. The second dry film 220' may also be a known dry film on which a photolithography process may be performed, and may be formed by a known applying method.

Figure 8F:
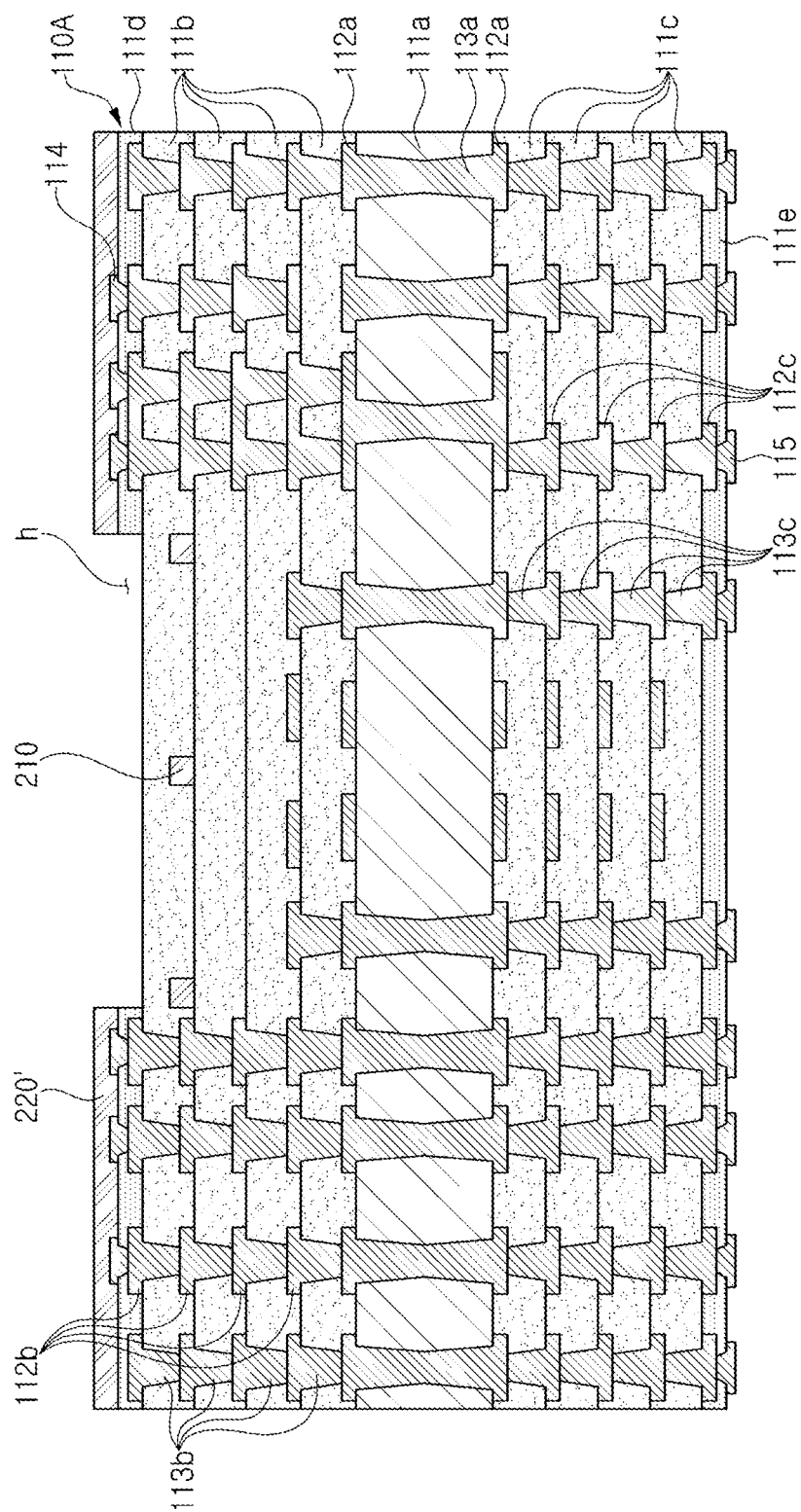

Referring to FIG. 8F, the second dry film 220' may be patterned to form a second dry film pattern 220. The patterning may be performed using exposure and development.

Figure 8G:
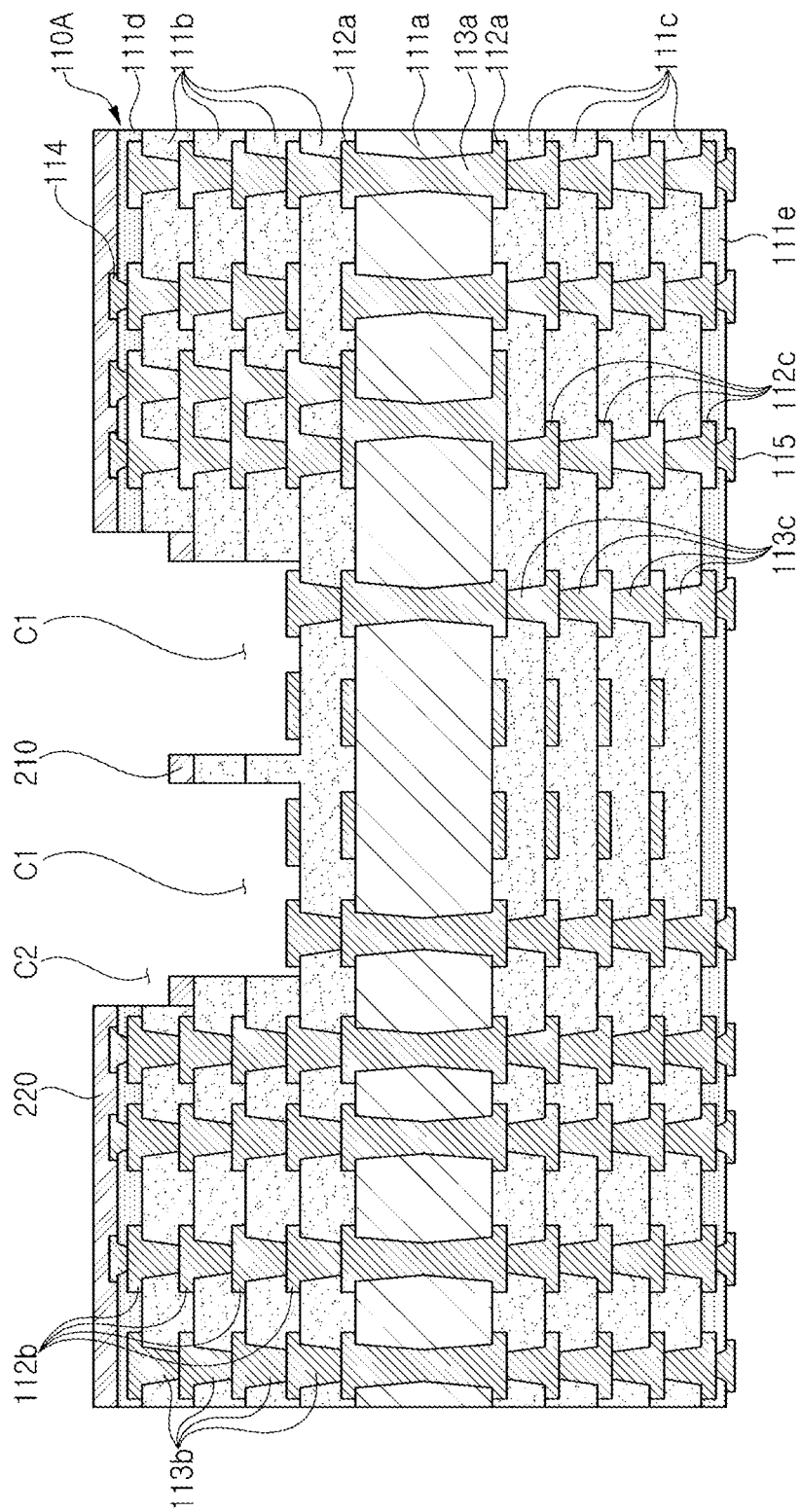

Referring to FIG. 8G, cavities C1 and C2 may be formed. The cavities C1 and C2 may be formed using a sandblasting process. In this case, the first and second dry film patterns 210 and 220 may be used as intermediate stoppers. Accordingly, a first cavity C1 and a second cavity C2 may be formed. The first cavity C1 may be formed to include a plurality of first cavities C1. The second cavity C2 may have the opening h of the first passivation layer 111d. As described above, the first cavity C1 and the second cavity C2 having a multi-stage shape and having different sizes may be formed through a single blasting process, and thus, additional costs may be reduced.

Figure 8H:
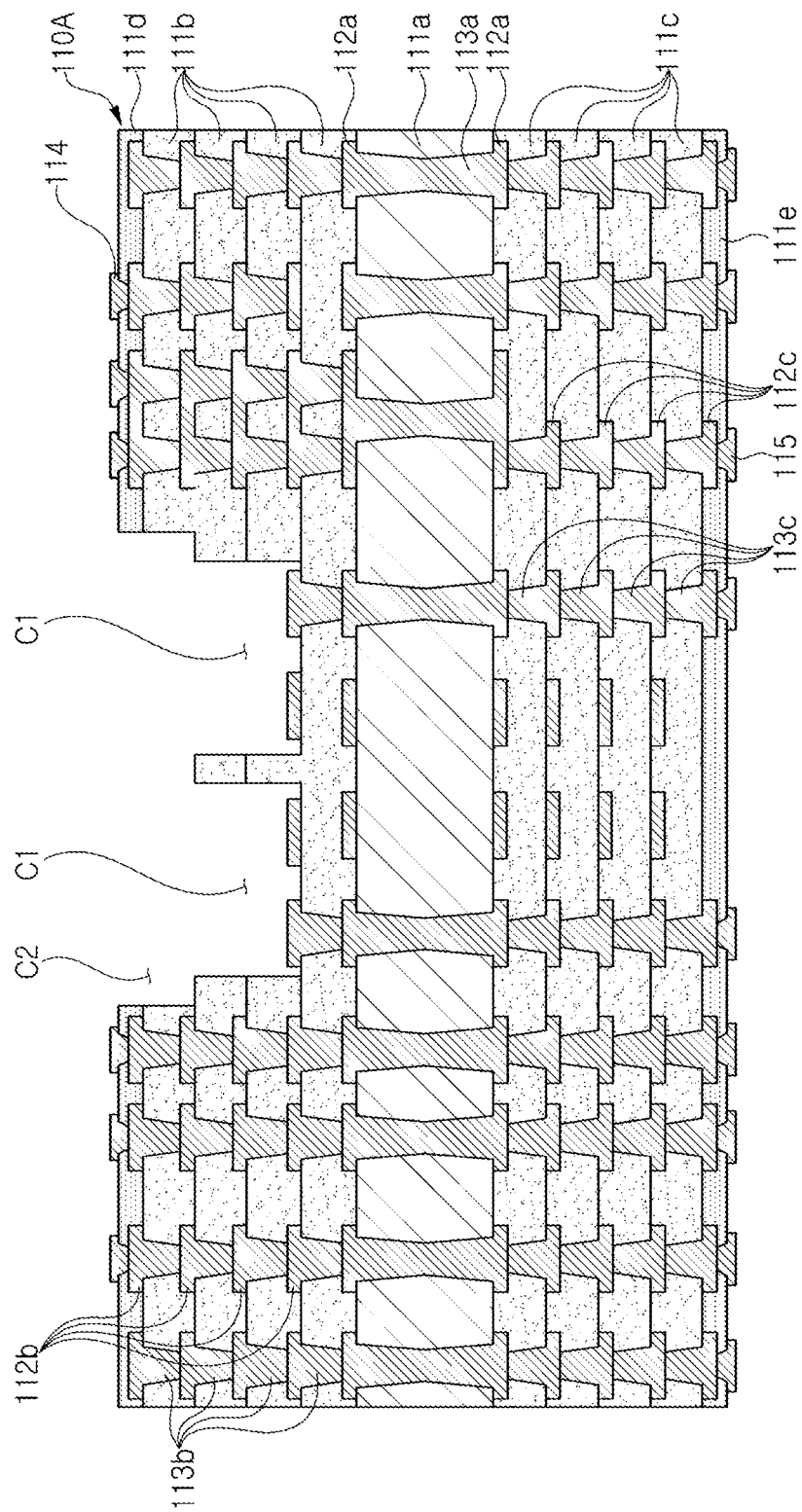

Referring to FIG. 8H, the first and second dry film patterns 210 and 220 may be removed. The removal of the first and second dry film patterns 210 and 220 may be performed using development.

Figure 8I:
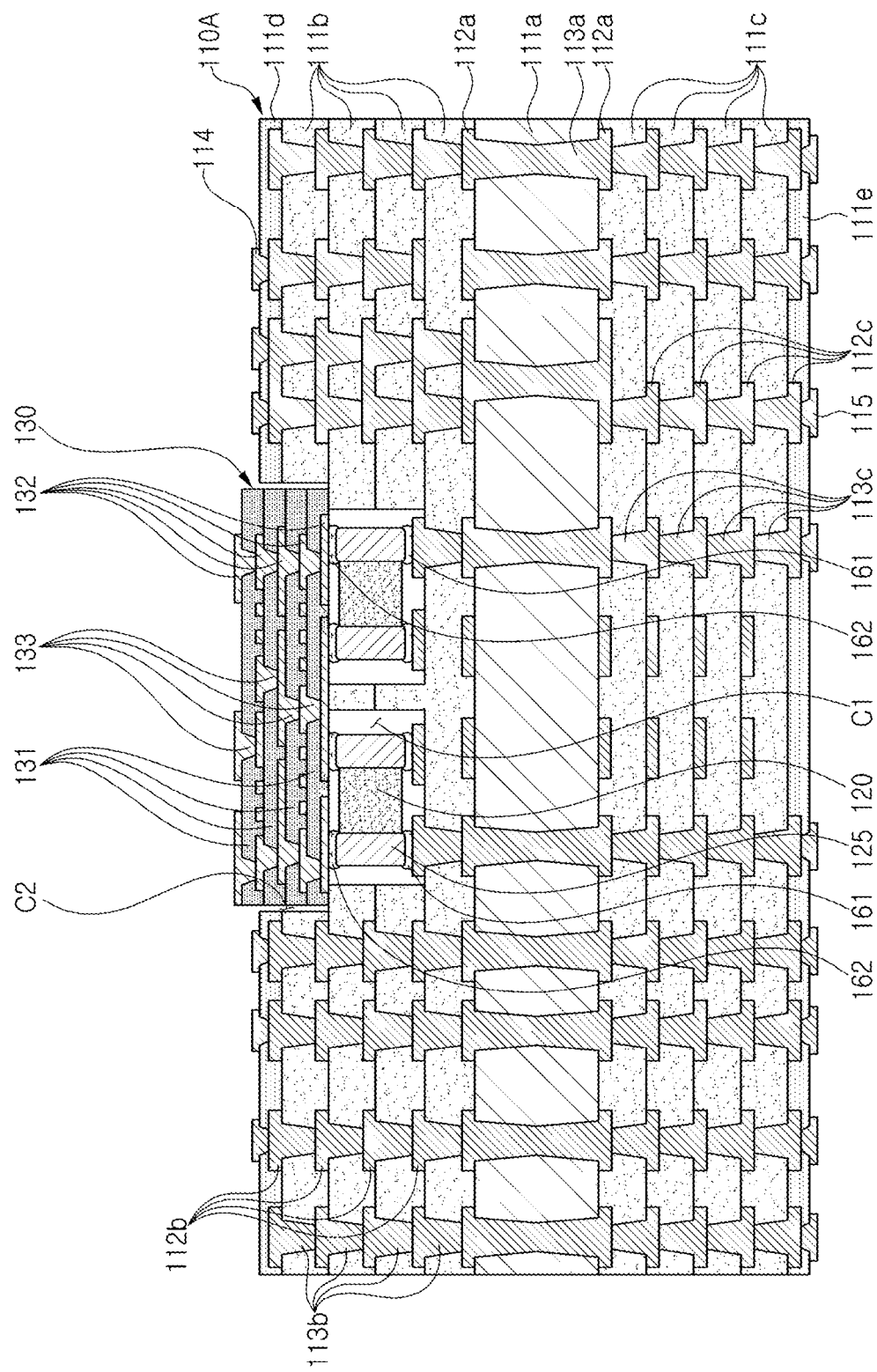

Referring to FIG. 8I, the passive component 120 may be disposed in the first cavity C1, and the bridge 130 may be disposed in the second cavity C2 thereon. The passive component 120 and the bridge 130 may sequentially mounted or may be mounted together in a state of being vertically stacked. The passive component 120 and the bridge 130 may be mounted through conductive adhesives 161 and 162. As described above, the passive component 120 and the bridge 130 are respectively disposed in the first cavity C1 and the second cavity C2 having the multi-stage shape, so that the bridge 130 may be more stably disposed, and then damage to the bridge 130 may be prevented when the dies 140 and 150 are mounted.

Next, when the plurality of dies 140 and 150 are mounted on the wiring substrate 110A, the above-described printed circuit board 100A according to an exemplary embodiment may be manufactured. However, this is only a manufacturing example, and the above-described printed circuit board 100A according to an exemplary embodiment may be manufactured by a different process.

Other contents, for example, the contents described in the above-described printed circuit board 100A according to an exemplary embodiment may be applied thereto unless they are inconsistent with the following descriptions. Therefore, duplicate descriptions thereof will be omitted.

Figure 9:
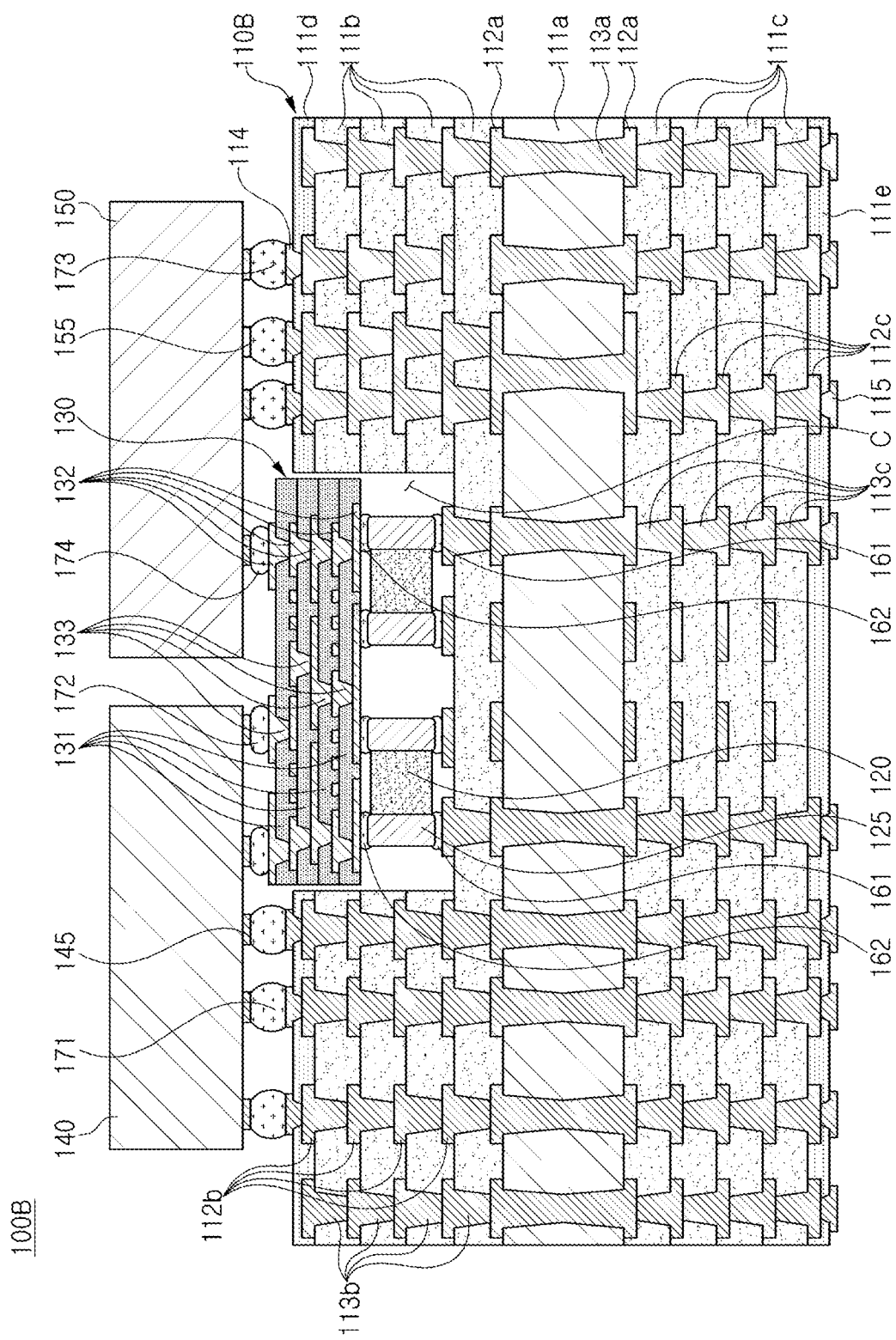
FIG. 9 is a schematic cross-sectional view illustrating a printed circuit board according to another exemplary embodiment.

FIG. 9 is a schematic cross-sectional view illustrating a printed circuit board according to another exemplary embodiment.

Figure 10:
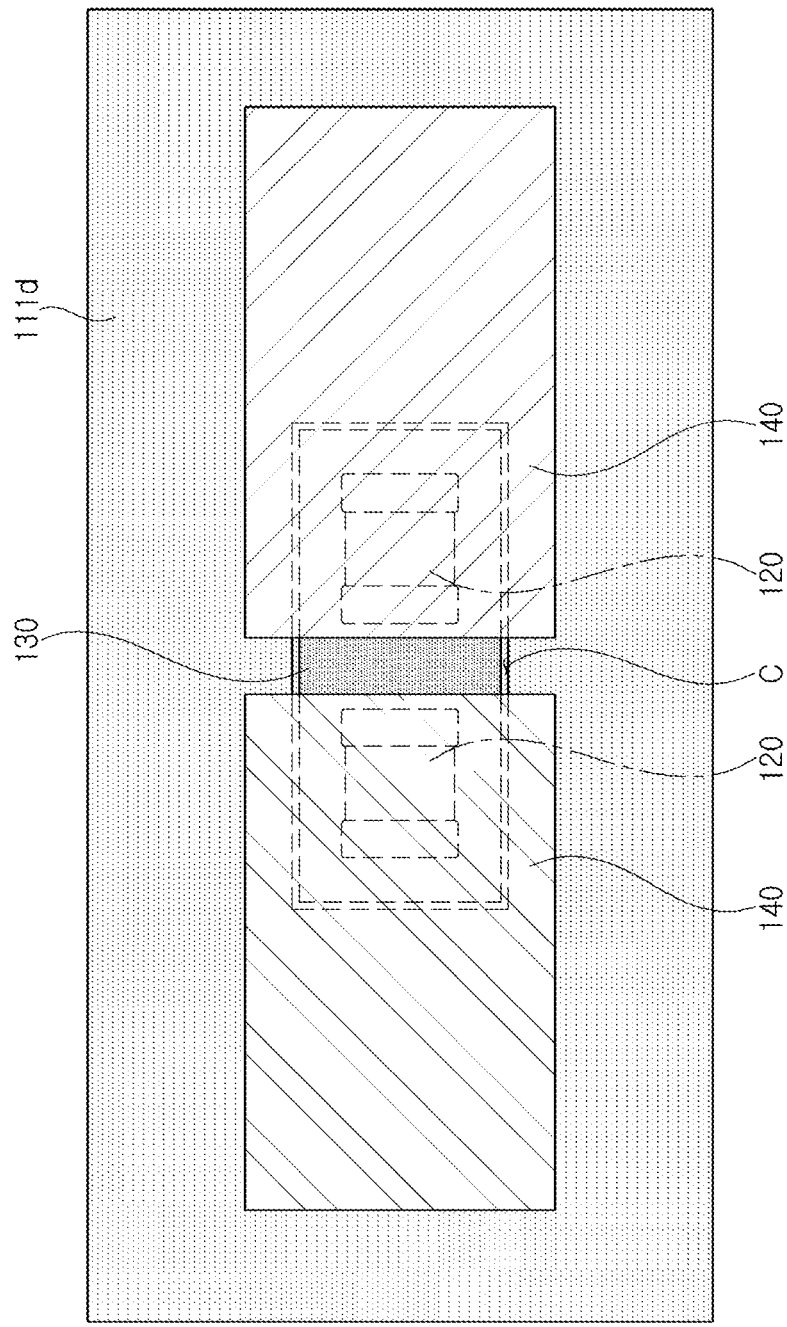
FIG. 10 is a schematic plan view illustrating a printed circuit board according to another exemplary embodiment.

FIG. 10 is a schematic plan view illustrating a printed circuit board according to another exemplary embodiment.

Referring to the drawings, a printed circuit board 100B according to another exemplary embodiment may have a single cavity C in which a wiring substrate 110B is integrated. In this case, the cavity C may be formed by a more simplified process. The cavity C may penetrate through a portion of a first build-up insulating layer 111b and a first passivation layer 111d. The passive component 120 and the bridge 130 may be vertically stacked in the cavity C to be disposed together.

Other contents, for example, the contents described in the above-described printed circuit board 100B according to another exemplary embodiment may be applied thereto unless they are inconsistent with the following descriptions. Therefore, duplicate descriptions thereof will be omitted.

FIGS. 11A to 11F are schematic process diagrams illustrating a method of manufacturing a printed circuit board according to another exemplary embodiment.

Figure 11A:
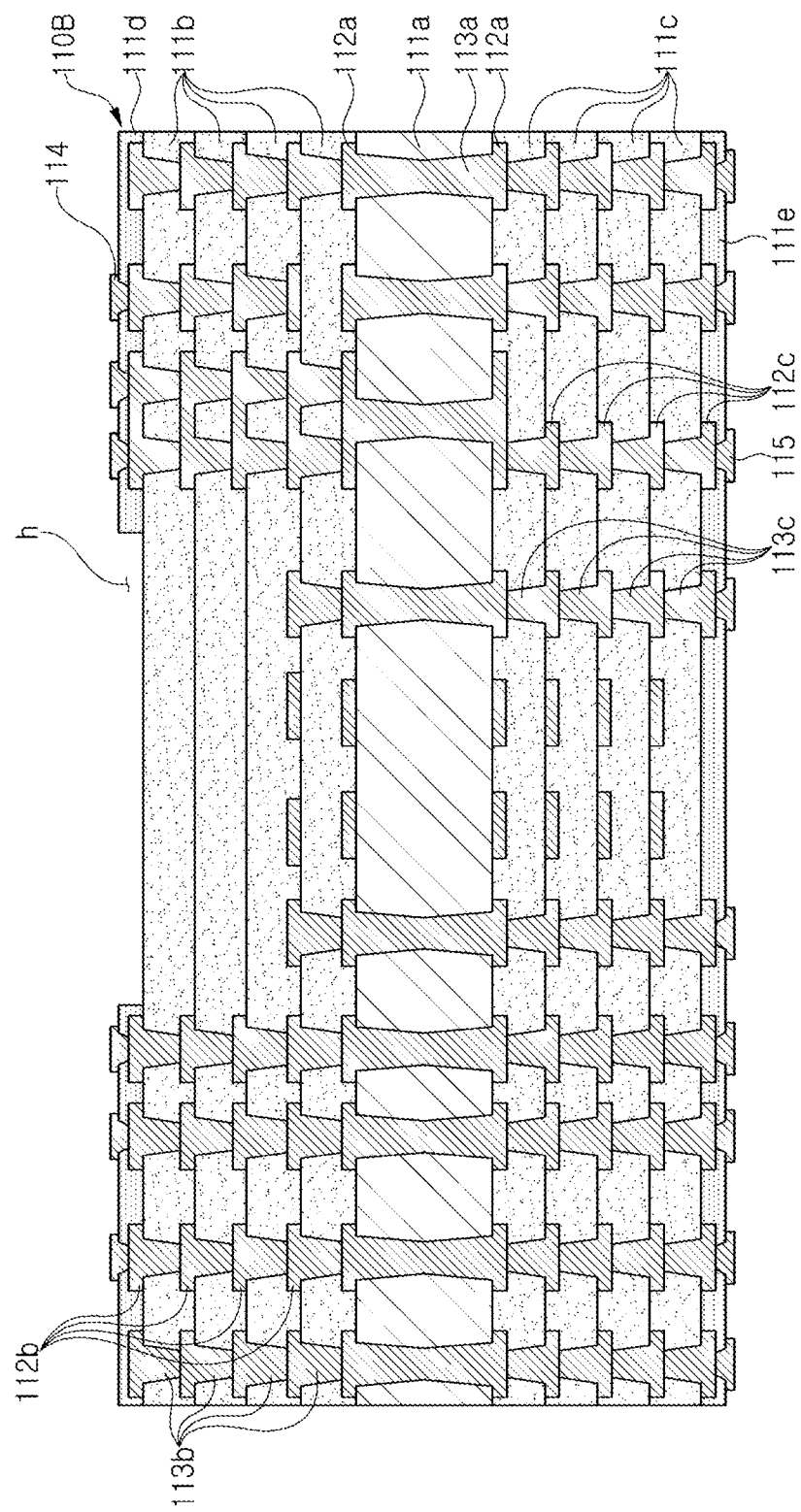
FIGS. 11A to 11F are schematic process diagrams illustrating a method of manufacturing a printed circuit board according to another exemplary embodiment.
Figure 11B:
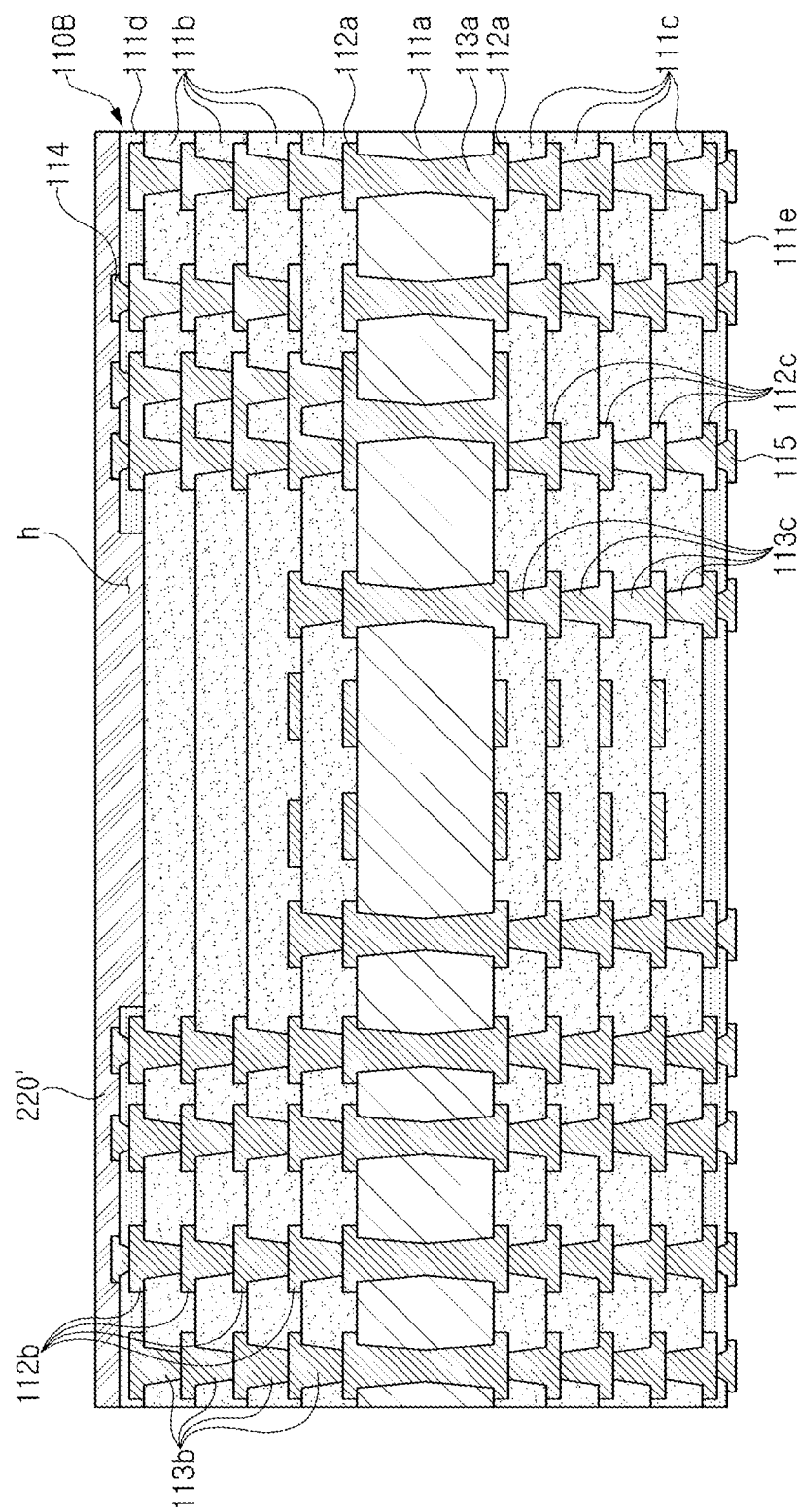
Figure 11C:
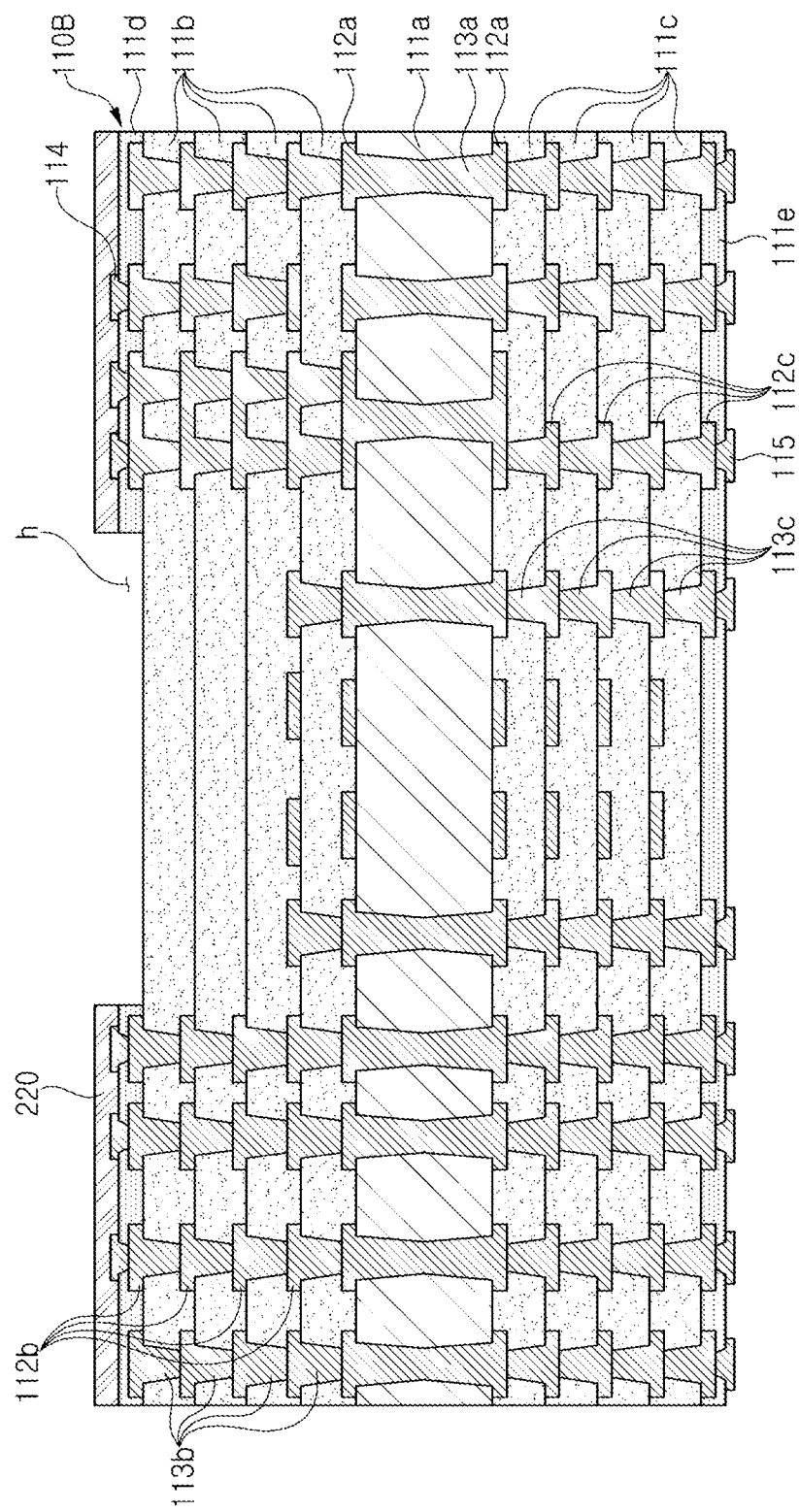
Figure 11D:
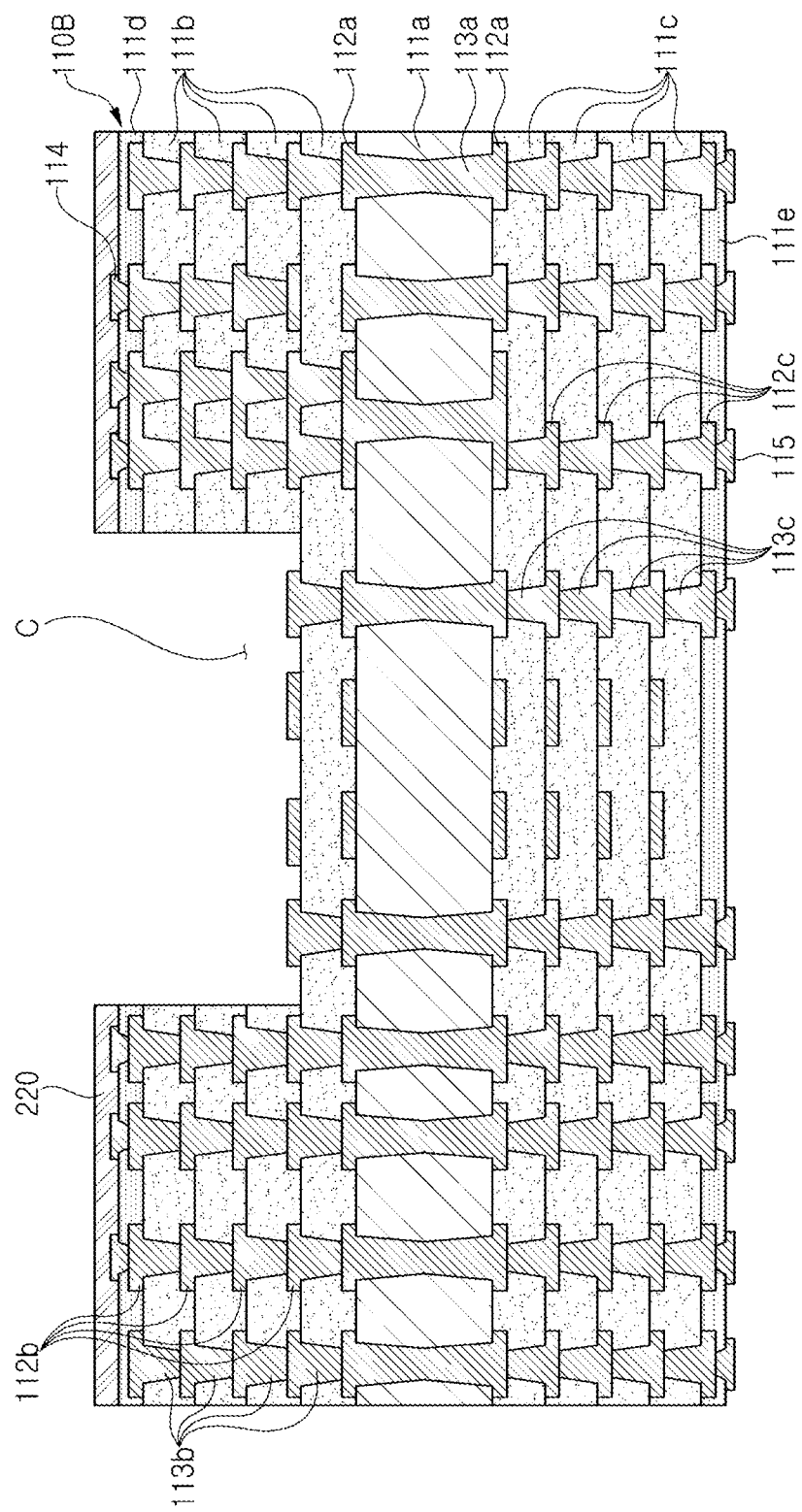
Figure 11E:
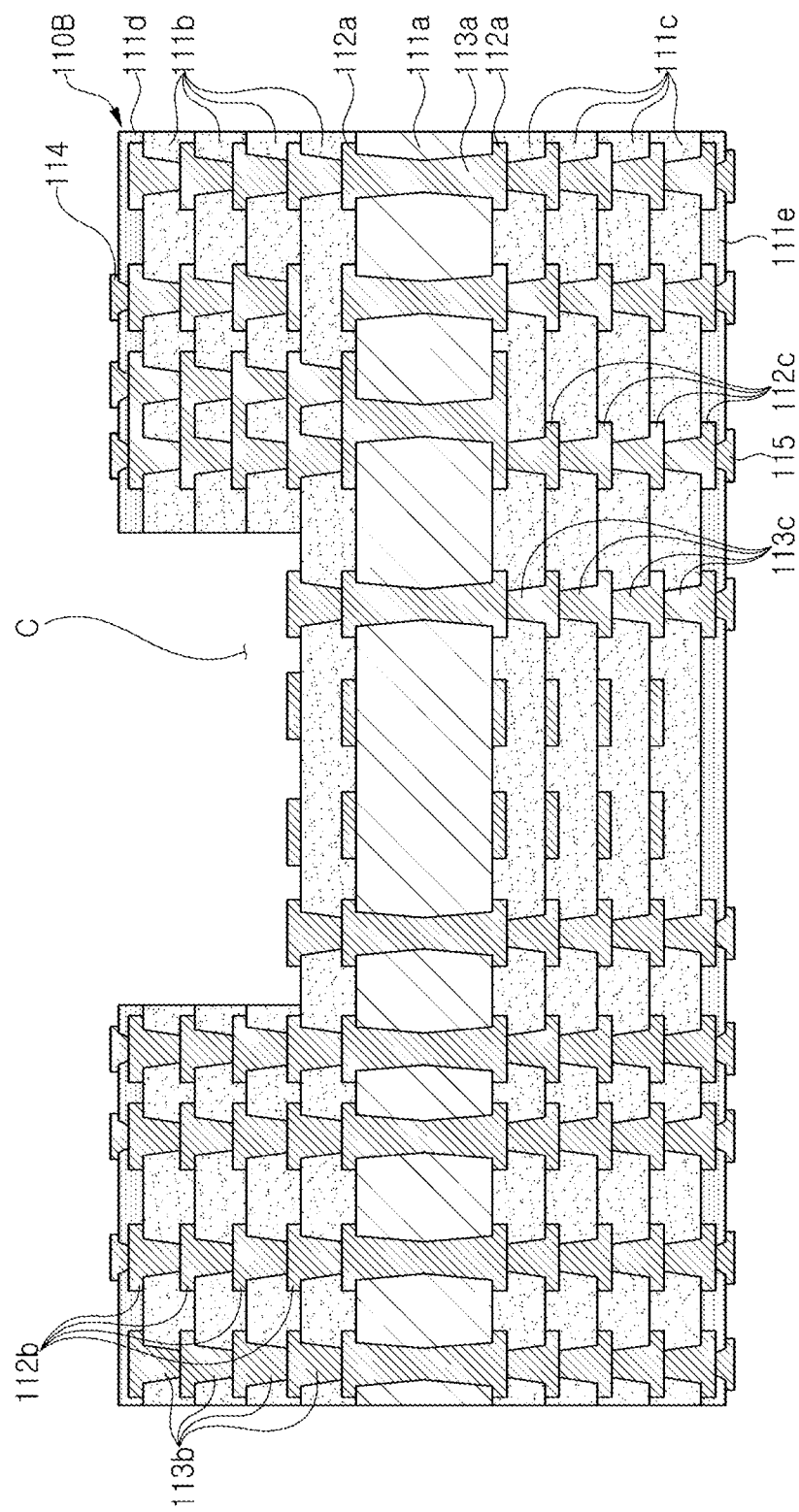
Figure 11F:
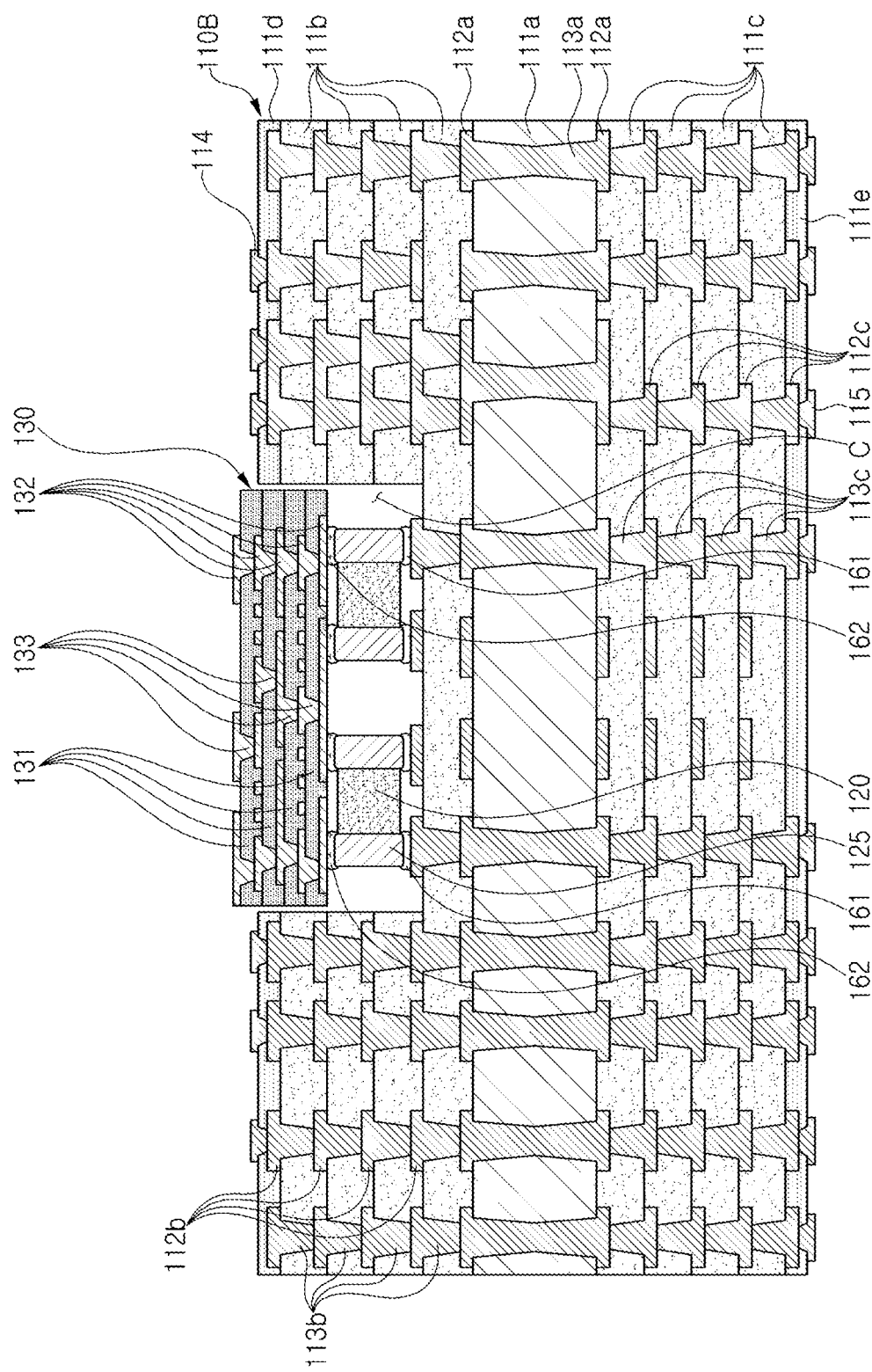

Referring to the drawings, in a manufacturing process of the printed circuit board 100B according to another exemplary embodiment, a wiring substrate 110B having an opening h may be prepared without an intermediate body, as illustrated in FIG. 11A. Then, a second dry film 220' may be formed on the wiring substrate 110B, as illustrated in FIG. 11B. Then, the second dry film 220' may be patterned to form a second dry film pattern 220, as illustrated in FIG. 11C. Then, a cavity C may be formed, as illustrated in FIG. 11D. Then, the second dry film pattern 220 may be removed, as illustrated in FIG. 11E. Then, a passive component 120 and a bridge 130 may be disposed in the cavity C, as illustrated in FIG. 11F.

Next, when a plurality of dies 140 and 150 are mounted on the wiring substrate 110B, the above-described printed circuit board 100B according to another exemplary embodiment may be manufactured. However, this is only a manufacturing example, and the above-described printed circuit board 100B according to another exemplary embodiment may be manufactured by a different process different.

Other contents, for example, the contents described in the above-described printed circuit boards 100A and 100B may be applied thereto unless they are inconsistent with the following descriptions. Therefore, duplicate descriptions thereof will be omitted.

As described above, a printed circuit board, in which a bridge for die-to-die interconnection may be disposed, may be provided.

In addition, a printed circuit board, which may reduce costs, may be provided.

In addition, a printed circuit board, which may improve power integrity characteristics, may be provided.

In exemplary embodiments, the terms "lower side," "lower portion," "lower surface," and the like, may be used to refer to directions toward a mounting surface of a semiconductor package including an organic interposer with reference to a cross-section in the diagrams for ease of description, and the terms "upper side," "upper portion," "upper surfaces," and the like, may be used to refer to directions opposing the above directions. The terms may be defined as above for ease of description, and the scope of right of the exemplary embodiments is not particularly limited to the above terms.

In the exemplary embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the exemplary embodiments.

In the exemplary embodiments, the term "exemplary embodiment" may not refer to one same exemplary embodiment, but may be provided to describe and emphasize different unique features of each exemplary embodiment. The above suggested exemplary embodiments may be implemented do not exclude the possibilities of combination with features of other exemplary embodiments. For example, even though the features described in one exemplary embodiment are not described in the other exemplary embodiment, the description may be understood as relevant to the other exemplary embodiment unless otherwise indicated.

While exemplary embodiments have been shown and described above, it will be apparent to those skilled in the art that modifications and variations could be made without departing from the scope of the present disclosure as defined by the appended claims.

What is claimed is:

1. A printed circuit board comprising:
a wiring substrate including a plurality of insulating layers, a plurality of wiring layers, and a plurality of via layers and having a cavity penetrating through a portion of the plurality of insulating layers;
a passive component disposed in the cavity; and
a bridge disposed on the passive component in the cavity, wherein the bridge includes one or more circuit layers, and
wherein the one or more circuit layers have a density higher than that of the plurality of wiring layers.

2. The printed circuit board of claim 1, wherein:
the cavity includes a first cavity, in which the passive component is disposed, and a second cavity, disposed on the first cavity, in which the bridge is disposed; and
the second cavity has a larger area on a plane than the first cavity.

3. The printed circuit board of claim 2, wherein:
external sidewalls of each of the first and second cavities have a step in a cross-section.

4. The printed circuit board of claim 2, wherein:
the first cavity includes a plurality of first cavities; and
the passive component includes a plurality of passive components, respectively disposed in the plurality of first cavities.

5. The printed circuit board of claim 4, wherein:
at least a portion of at least one of the plurality of insulating layers is disposed between the plurality of first cavities.

6. The printed circuit board of claim 1, wherein:
the passive component includes an external electrode; and
a lower portion of the external electrode is bonded to a wiring layer exposed from a bottom surface of the cavity, among the plurality of wiring layers, by a solder.

7. The printed circuit board of claim 6, wherein
an upper portion of the external electrode is bonded to a circuit layer disposed on a lowermost side, among the one or more circuit layers, by a solder.

8. The printed circuit board of claim 1, wherein:
the passive component includes a chip-type multilayer ceramic capacitor (MLCC).

9. The printed circuit board of claim 1, wherein:
the bridge further includes one or more insulating layers and one or more via layers; and
the one or more insulating layers include an organic insulating material.

10. The printed circuit board of claim 1, further comprising:
a plurality of dies disposed side by side on the wiring substrate to be spaced apart from each other and connected to each other through the bridge, wherein:
each of the plurality of dies is connected to the wiring layers disposed on an uppermost side, among the plurality of wiring layers, in a region outside of the cavity.

11. A printed circuit board comprising:
a wiring substrate including a plurality of insulating layers, a plurality of wiring layers, and a plurality of via layers connected to one or more of the plurality of wiring layers; and
a first passive component and a bridge connected to each other by a solder and embedded in the wiring substrate, wherein the bridge includes one or more circuit layers, and
wherein the one or more circuit layers have a density higher than that of the plurality of wiring layers.

12. The printed circuit board of claim 11, further comprising a second passive component connected to the bridge through another solder, wherein:
the first passive component and the second passive component are disposed on a same side of the bridge.

13. The printed circuit board of claim 12, wherein:
a portion of the plurality of insulating layers is disposed between the first passive component and the second passive component.

14. The printed circuit board of claim 11, wherein:
the bridge further includes one or more insulating layers and one or more via layers; and
the one or more insulating layers include an organic insulating material.

15. The printed circuit board of claim 11, further comprising:
a plurality of dies disposed side by side on the wiring substrate to be spaced apart from each other and connected to the bridge, wherein:
the plurality of dies partially overlap the bridge in a stacking direction of the plurality of wiring layers, and are disposed on one side of the bridge opposite to another side of the bridge on which the first passive component is disposed.

16. The printed circuit board of claim 15, further comprising solders connecting the plurality of dies to the wiring substrate and to the bridge.

17. The printed circuit board of claim 11, wherein:
the first passive component is spaced apart from the wiring substrate, and the bridge is in contact with the wiring substrate.

* * * * *